(12) United States Patent
Choi et al.

(10) Patent No.: US 7,754,294 B2
(45) Date of Patent: Jul. 13, 2010

(54) METHOD OF IMPROVING THE UNIFORMITY OF PECVD-DEPOSITED THIN FILMS

(75) Inventors: Soo Young Choi, Fremont, CA (US); Tae Kyung Won, San Jose, CA (US); John M. White, Hayward, CA (US)

(73) Assignee: Applied Materials, Inc., Santa Clara, CA (US)

( * ) Notice: Subject to any disclaimer, the term of this patent is extended or adjusted under 35 U.S.C. 154(b) by 9 days.

(21) Appl. No.: 12/215,602

(22) Filed: Jun. 25, 2008

(65) Prior Publication Data

US 2008/0268176 A1 Oct. 30, 2008

Related U.S. Application Data

(63) Continuation of application No. 10/962,936, filed on Oct. 12, 2004, now abandoned, which is a continuation-in-part of application No. 10/829,016, filed on Apr. 20, 2004, now Pat. No. 7,125,758.

(51) Int. Cl.
*H05H 1/24* (2006.01)
(52) U.S. Cl. .................. 427/569; 427/578; 427/579
(58) Field of Classification Search ............... 427/569, 427/574
See application file for complete search history.

(56) References Cited

U.S. PATENT DOCUMENTS

| | | | |
|---|---|---|---|
| 5,399,387 A * | 3/1995 | Law et al. ................. 427/574 |
| 5,928,732 A | 7/1999 | Law et al. ................. 427/579 |
| 6,040,022 A | 3/2000 | Chang et al. .............. 427/579 |
| 6,150,283 A | 11/2000 | Ishiguro ................... 438/758 |
| 6,338,874 B1 | 1/2002 | Law et al. .............. 427/255.18 |
| 2002/0006478 A1* | 1/2002 | Yuda et al. ................ 427/579 |
| 2002/0146879 A1 | 10/2002 | Fu et al. ................... 438/230 |
| 2002/0189545 A1 | 12/2002 | Matsumura et al. ........ 219/390 |
| 2003/0199175 A1 | 10/2003 | Tang et al. ................ 438/791 |
| 2004/0043637 A1 | 3/2004 | Aota et al. ................ 438/791 |

FOREIGN PATENT DOCUMENTS

| EP | 1168427 | | 1/2002 |
|---|---|---|---|
| EP | 1286386 A1 * | | 2/2003 |

OTHER PUBLICATIONS

Schmitt et al. Glow discharge processing in the liquid crystal display industry. Plasma Sources Sci. Technol. 11 (2002) 206-210.*
S. K. Kim, et al., "A Novel Self-Aligned Co-Planar Amorphous Silicon Thin Film Transistor", ISSN0098-0966X/98/2901 (1998).
*Y. Kuo, "Plasma Enhanced Chemical Vapor Deposited Silicon Nitride as a Gate Dielectric Film for Amorphous Silicon Thin Film Transistors—A Critical Review", *Vacuum*, vol. 51, No. 4, pp. 741-745, Elsevier Science, Ltd., Pergamon Press, Great Britain, Dec. 1998.

(Continued)

*Primary Examiner*—David Turocy
(74) *Attorney, Agent, or Firm*—Shirley L Church

(57) ABSTRACT

We have discovered that controlling a combination of PECVD deposition process parameters during deposition of silicon-containing thin film provides improved control over surface standing wave effects. By minimizing surface standing wave effects, the uniformity of film properties (particularly film thickness) across a substrate surface onto which the films have been deposited is improved.

17 Claims, 11 Drawing Sheets

OTHER PUBLICATIONS

L. Kyung-ha, "A Study on Laser Annealed Polycrystalline Silicon Thin Film Transistors (TFTs) with SiNx Gate Insulator, Chapter 2. Review of ELA Poly-Si TFT-LCDs", Kyung Hee University, Ch. 2 (1998). http://tftlcd.kyunghee.ac.kr/research/poly-Si.

M. A. Lieberman, et al., "Standing wave and skin effects in large-area, high-frequency capacitive discharges", *Plasma Sources Sci. Technol*, vol. 11, pp. 283-293 (2002).

Y. B. Park, et al., "Bulk and Interface Properties of Low-Temperature Silicon Nitride Films Deposited by Remote Plasma Enhanced Chemical Vapor Deposition", *Journal of Materials Science: Materials in Electronics*, vol. 12, pp. 515-522 (2001).

A. Sazonov, et al., "Low Temperature a-Si:H TFT on Plastic Films: Materials and Fabrication Aspects", *Proc. 23$^{rd}$ International Conference on Microelectronics (MIEL 2002)*, vol. 2, pp. 525-528 (May 2002).

D. B. Thomasson et al., "High Mobility Tri-Layer a-Si:H Thin Film Transistors with Ultra-Thin Active Layer", *IEEE Electron Device Letters*, vol. 18, No. 8, pp. 397-399, (Aug. 1997).

International Search Report of related PCT Application No. PCT/US2005/012832.

* cited by examiner

METHOD OF IMPROVING THE UNIFORMITY OF PECVD-DEPOSITED THIN FILMS

RELATED APPLICATIONS

This application is a Continuation Application of U.S. patent application Ser. No. 10/962,936, filed Oct. 12, 2004, and entitled, "Method of Controlling the Uniformity of PECVD-Deposited Thin Films", now abandoned, which is a continuation-in-part of U.S. application Ser. No. 10/829,016, filed Apr. 20, 2004, and entitled, "Controlling the Properties and Uniformity of a Silicon Nitride Film by Controlling the Film Forming Precursors", which issued as U.S. Pat. No. 7,125,578, on Oct. 24, 2006.

BACKGROUND OF THE INVENTION

1. Field of the Invention

The present invention pertains to a method of controlling surface standing wave effects during PECVD deposition of a silicon-containing thin film. By controlling surface standing wave effects during film deposition, the uniformity of a silicon nitride film deposited by PECVD (plasma-enhanced chemical vapor deposition) can be tightly controlled over a large surface area.

2. Brief Description of the Background Art

Current interest in thin film transistor (TFT) arrays is particularly high because these devices are used in liquid crystal active matrix displays of the kind often employed for computer and television flat panels. The liquid crystal active matrix displays may also contain light emitting diodes for back lighting. Further, organic light emitting diodes (OLEDs) have been used for active matrix displays, and these organic light emitting diodes require TFTs for addressing the activity of the displays.

The TFT arrays are typically created on a flat substrate. The substrate may be a semiconductor substrate, or may be a transparent substrate, such as a glass, quartz, sapphire, or a clear plastic film. The TFT which is the subject of the present invention employs silicon-containing films, and, in particular, employs silicon nitride-containing films for dielectric layers. A first silicon nitride-comprising film is referred to as the gate dielectric because it overlies the conductive gate electrode. A second silicon nitride-comprising film is referred to as the passivation dielectric and overlies the upper surface of a second conductive electrode, to electrically isolate the second conductive electrode from the ambient surrounding the upper surface of the TFT device (where the lower surface of the TFT device is the glass, quartz, sapphire, plastic, or semiconductor substrate).

FIG. 1 illustrates a schematic cross-sectional view of a thin film transistor structure of the kind which may employ both a silicon nitride-comprising gate dielectric film and a silicon nitride-comprising passivation dielectric film. This kind of thin film transistor is frequently referred to as an inverse staggered α-Si TFT with a $SiN_x$ layer as a gate insulator, or as a back channel etch (BCE) inverted staggered (bottom gate) TFT structure. This structure is one of the more preferred TFT structures because the gate dielectric ($SiN_x$) and the intrinsic as well as n+ (or p+) doped amorphous silicon films can be deposited in a single PECVD pump-down run. The BCE TFT shown in FIG. 1 involves only four or five patterning masks.

As previously mentioned, the substrate 101 for a TFT structure typically comprises a material that is essentially optically transparent in the visible spectrum, such as glass, quartz, sapphire, or a clear plastic. The substrate may be of varying shapes or dimensions. Typically, for TFT applications, the substrate is a glass substrate with a surface area greater than about 500 mm². A surface area of greater than about 25,000 mm² is not uncommon. A gate electrode layer 102 is formed on the substrate 101. The gate electrode layer 102 may comprise a metal layer such as, for example, aluminum (Al), tungsten (W), chromium (Cr), tantalum (Ta), molybdenum (Mo), molybdenum tungsten (MoW), titanium (Ti), or combinations thereof, among others. The gate electrode layer 102 may be formed using conventional deposition, lithography, and etching techniques. Between the substrate 101 and the gate electrode layer 102, there may be an optional (not shown) insulating layer, for example, such a silicon oxide or silicon nitride, which may also be formed using a PECVD system of the kind which will be described later herein.

A gate dielectric layer 103 is formed on the gate electrode layer 102. The gate dielectric layer may be silicon oxide, silicon oxynitride, or silicon nitride, deposited using such a PECVD system. The gate dielectric layer 103 may be formed to a thickness in the range of about 100 Å to about 6000 Å.

A bulk semiconductor layer 104 is formed on the gate dielectric layer 103. The bulk semiconductor layer 104 may comprise polycrystalline silicon (polysilicon), microcrystalline silicon (μc-Si), or amorphous silicon (α-silicon), which films can also be deposited using a PECVD system or other conventional methods known in the art. Bulk semiconductor layer 104 may be deposited to a thickness in the range of about 100 Å to about 3000 Å. A doped semiconductor layer 105 is formed on top of the semiconductor layer 104. The doped semiconductor layer 105 may comprise n-type (n+) or p-type (p+) doped polycrystalline, microcrystalline, or amorphous silicon. Doped semiconductor layer 105 may be deposited to a thickness within a range of about 100 Å to about 3000 Å. An example of the doped semiconductor layer 105 is n+ doped α-silicon film. The bulk semiconductor layer 104 and the doped semiconductor layer 105 are lithographically patterned and etched using conventional techniques to define a mesa of these two films over the gate dielectric insulator, which also serves as storage capacitor dielectric. The doped semiconductor layer 105 directly contacts portions of the bulk semiconductor layer 104, forming a semiconductor junction.

A conductive layer 106 is then deposited on the exposed surfaces of gate dielectric layer 103, semiconductor layer 104, and doped semiconductor layer 105. The conductive layer 106 may comprise a metal such as, for example, aluminum, tungsten, molybdenum, chromium, tantalum, and combinations thereof, among others. The conductive layer 106 may be formed using conventional deposition techniques. Both the conductive layer 106 and doped semiconductor layer 105 may be lithographically patterned to define source and drain contacts of the TFT, 106a and 106b, respectively, in FIG. 1. After formation of the source and drain contacts 106a and 106b, a passivation dielectric layer 107 is typically applied. The passivation dielectric layer may be, for example, silicon oxide or silicon nitride. The passivation layer 107 may be formed using, for example, PECVD or other conventional methods known in the art. The passivation layer 107 may be deposited to a thickness in the range of about 1000 Å to about 5000 Å. The passivation layer 107 is then lithographically patterned and etched using conventional techniques, to open contact holes in the passivation layer.

A transparent electrically conductive layer 108 is then deposited and patterned to make contacts with the conductive layer 106. The transparent conductor layer 108 comprises a material that is essentially optically transparent in the visible spectrum. Transparent conductor 108 may comprise, for example, indium tin oxide (ITO) or zinc oxide among others. Patterning of the transparent electrically conductive layer 108 is accomplished by conventional lithographic and etching methods.

There are a number of additional TFT structures which can employ silicon nitride gate insulators, and several of these are presented in a disclosure entitled "A Study on Laser Annealed Polycrystalline Silicon Thin Film Transistors (TFTs) with SiNx Gate Insulator", by Dr. Lee Kyung-ha (Kyung Hee University, 1998). This disclosure is available at http://tftcd-.khu.ac.kr/research/polySi. Dr. Lee Kyung-ha's disclosure pertains mainly to the use of laser annealed poly-Si TFTs, which is not the subject matter of the present invention, but the TFT structures are of interest as background material. The structures of interest are presented in Chapter 2 of the disclosure.

D. B. Thomasson et al., in an article entitled: "High Mobility Tri-Layer a-Si:H Thin Film Transistors with Ultra-Thin Active Layer" (1977 Society for Information Display International Symposium Digest of Technical Papers, volume 28, pages 176-179), describe active matrix liquid crystal displays where the TFT has an active layer thickness of about 13 nm. The TFT structure is a glass substrate with a molybdenum bottom electrode, a silicon nitride gate dielectric layer, an a-Si:H layer overlying the silicon nitride gate dielectric layer, n+ μc-Si:H doped source and drain regions, separated by a silicon nitride dielectric mesa, and with an aluminum contact layer overlying each source and drain region. This is referred to as a Tri-layer a-Si:H TFT structure. The authors claim that such hydrogenated amorphous silicon thin-film transistors with active layer thickness of 13 nm perform better for display applications than devices with thicker (50 nm) active layers. The linear ($V_{DS}$=0.1V) and saturation region mobility of a 5 μm channel length device is said to increase from 0.4 $cm^2$/V·sec and 0.7 $cm^2$/V·sec, for a 50 nm a-Si:H device, to 0.7 $cm^2$/V·sec and 1.2 $cm^2$/V·sec, for a 13 nm a-Si:H layer device fabricated with otherwise identical geometry and processing. The gate dielectric silicon nitride was deposited from a reactant gas mixture of $SiH_4$, $NH_3$, and Ar at 100 mW/$cm^2$, −150 V, 0.5 Torr, and 300° C. The passivation silicon nitride dielectric layer was deposited at the same conditions as the gate dielectric, with the exception of the substrate temperature, which was 250° C.

Young-Bae Park et al., in an article entitled: "Bulk and interface properties of low-temperature silicon nitride films deposited by remote plasma enhanced chemical vapor deposition" (Journal of Materials Science: Materials in Electronics 23 (2001), pp. 515-522), describe problems which occur when a gate dielectric, rather than being $SiN_x$, is a hydrogenated silicon nitride film (a-$SiN_x$:H). PECVD a-$SiN_x$:H thin films are said to be widely used as a gate dielectric for a-Si:H TFT applications, due to the good interfacial property between an a-Si:H layer and an a-$SiN_x$:H layer. However, the a-Si:H TFTs with $SiN_x$:H gate dielectric are said to have instability problems, such as the threshold voltage shift and the inverse subthreshold slope under a DC gate voltage bias. These instability problems are said to be caused by the high trap density in the $SiN_x$:H film and the defects created at the a-Si:H/$SiN_x$:H interface. Charge trapping in the $SiN_x$:H is said to be from the electron injection under an applied field and due to the localized states of the Si dangling bonds, Si—H and N—H bonds in the forbidden gap. The authors claim that PECVD $SiN_x$:H dielectric films are not useful as a gate insulator because they contain large amounts of bonded hydrogen (20%-40%) in the form of N—H and Si—H bonds.

The authors propose that a remote plasma enhanced chemical vapor deposition of the gate dielectric layer be carried out. The $NH_3$ precursor is excited in a remote plasma zone (at the top of the chamber) to produce NH* or $NH_2$*+H*, after which the activated species* from the plasma zone react with $SiH_4$ introduced downstream through a gas dispersal ring to form the $SiN_x$:H electrical insulator with a reduction in the amounts of bonded hydrogen in the form of Si—H bonds, which are said to easily lose hydrogen to form a dangling bond of the kind known to reduce performance of the TFT device over time.

A presentation entitled: "Low Temperature a-Si:H TFT on Plastic Films: Materials and Fabrication Aspects", by Andrei Sazonov et al. (Proc. 23rd International Conference on Microelectronics (MIEL 2002), Vol. 2, NIS, Yugoslavia, 12-15 May 2002), related to fabrication technology for a-SiH thin film transistors at 120° C. for active matrix OLED displays on flexible plastic substrates. The TFTs produced were said to demonstrate performance very close to those fabricated at 260° C. The authors claim that, with the proper pixel integration, amorphous hydrogenated silicon (a-Si:H) TFTs are capable of supplying sufficiently high current to achieve required display brightness and thus can be a cost-effective solution for active matrix OLED displays.

The silicon nitride films used to produce the fabricated TFT samples were amorphous silicon nitride deposited at 120° C. by PECVD from $SiH_4$ and $NH_3$ gaseous precursors. The film is said to have a lower mass density and higher hydrogen concentration in comparison with films fabricated at 260° C. to 320° C. In the study, a series of a-$SiN_x$:H films with [N]/[Si] ratio ranging from 1.4 to 1.7 were deposited (at 120° C.). The hydrogen content in the films was in the range of 25-40 atomic percent. Generally, the films with higher [N]/[Si] are said to have higher mass density and higher compressive stress. The resistivity of a-$SiN_x$:H films estimated at the field of 1 MV/cm was said to be in the range of $10^{14}$-$10^{16}$ Ohm·cm, and the films with higher [N]/[Si] were said to have a higher breakdown field and dielectric constant than their lower N-content counterparts. A table of data supporting these conclusions is presented.

Compared to their higher temperature counterparts, the lower temperature a-$SiN_x$ films are characterized by higher hydrogen content. The nitrogen-rich films with a hydrogen concentration of about 40% or more exhibit hydrogen bonded predominantly to nitrogen atoms, with a high [N]/[Si] ratio achieved solely due to the high concentration of N—H bonds. The TFTs produced an a plastic film substrate at lower temperatures require a higher threshold voltage (4-5 V) than the TFTs produced on glass at the higher temperatures. As a result, the ON current observed for TFTs produced at the lower temperatures is lower. Although the performance properties of these TFTs complies with the requirements for OLED applications, it is apparent that it would be beneficial to lower the threshold voltage of the TFTs produced at the 120° C. temperature.

As indicated above, the performance capabilities of the TFT are a direct result of the structural characteristics of the films formed during fabrication of the TFTs. The structural characteristics of the films depend directly upon the process conditions and relative amounts of precursors which are used during formation of the films which make up the TFTs. As the size of flat panel displays increase, it becomes increasingly difficult to control the uniformity of the individual films produced across the increased surface area. With respect to PECVD deposited silicon-nitride comprising films, which are used either as the gate dielectric layer or as the passivation dielectric layer, control of uniformity of the film across the substrate becomes particularly difficult when the PECVD is carried out in a process chamber having parallel-plate capacitively-coupled electrodes over about one meter by one meter. At the higher RF power applications, the RF power appears to concentrate at the center of the electrode area, resulting in a dome-shaped thickness profile, and film properties are indicative of the non-uniform power distribution across the electrodes. This kind of phenomenon is more pronounced at the higher RF power which is used to obtain film deposition rates (D/R) which are in excess of about 1000 Å/min.

Conventional PECVD processes for producing a-SiN$_x$:H films employ a precursor gas mixture which is highly diluted with nitrogen (N$_2$) to obtain desired film properties. Such desired film properties are: a compressive film stress in the range of about 0 to $-10^{10}$ dynes/cm$^2$; low Si—H content of typically less than about 15 atomic %; and a low wet etch rate in HF solution (WER) of less than about 800 Å/min (normalized to thermal oxide at 1000 Å/min). However, a plasma produced at high concentrations of N$_2$ (where N$_2$:SiH$_4$ is greater than 2:1) in the precursor gas produces a particularly non-uniform plasma over a large surface area, for example a substrate having dimensions larger than about 1000 mm×1000 mm (1 m$^2$). This is believed to be due to the higher energy required to achieve dissociation of N$_2$ molecules. To overcome this problem with respect to the production of flat panel displays having large surface areas, the N$_2$ precursor gas was replaced by NH$_3$ precursor gas, which dissociates more easily.

More recently, there has been increased demand for even larger flat panel displays, for example, those with substrates having dimensions larger than about 1500 mm×1800 mm. Initial efforts to produce flat panel displays of this size using an NH$_3$ precursor to supply nitrogen during formation of the a-SiN$_x$:H gate dielectric films resulted in the formation of a-SiN$_x$:H films exhibiting a higher hydrogen content in the film. As discussed above, this higher hydrogen content leads to a higher threshold voltage requirement for the TFT, which is harmful to performance of the TFT. There is presently a need for a process which permits formation of the a-SiN$_x$:H gate dielectric films over large surface area substrates.

In the past, the basic principle behind the scale-up of PECVD processes was to maintain the intensive deposition parameters (such as process chamber pressure, electrode spacing, and substrate temperature) constant, while proportionately increasing the extensive deposition parameters (such as process gas flow rates and RF power to the plasma). However, due to ever increasing substrate sizes, which now approach a surface area of 30,000 mm$^2$, most PECVD processes do not properly scale up by adjustment of extensive deposition parameters alone, for various reasons. Furthermore, with respect to the extensive deposition parameters, fundamental problems may arise in the uniformity of film thickness and other film properties across the substrate surface as a consequence of non-uniform RF power density within the processing chamber.

A description of various surface wave effects which may affect power density distribution appears in an article by M. A. Lieberman et al., "Standing wave and skin effects in large-area, high-frequency capacitive discharges", *Plasma Sources Sci. Technol.*, Vol. 11, pp. 283-293 (2002), and M. A. Lieberman, *Principles of Plasma Discharges and Materials Processing*, Wiley-Interscience, New York (1994), for example.

FIGS. 5A and 5B illustrate theoretic modeling of a cylindrical parallel plate, capacitively coupled reactor. The reactor 500, shown in cross-section in FIG. 5A, includes an upper electrode 502 and a lower electrode 504, which typically supports a substrate (not shown). RF power source 506 provides power to upper electrode 502, to generate a plasma 508 between upper electrode 502 and lower electrode 504. FIG. 5B shows a cross-section taken at the center of the plasma region 508, where R is the radius of the electrode (in meters), d is half the plasma width (in millimeters), L is the half-spacing between the electrodes (in millimeters), and s is the plasma sheath width (in millimeters).

Evanescent wave skin effects exhibit a sharp maximum at the edge, then rapidly decay toward the center. With proper engineering of the plasma reactor periphery, evanescent wave skin effects can typically be expressed outside the area of the substrate surface.

Surface wave skin effects begin to have a significant effect on plasma uniformity when the plasma electron density ($n_e$) reaches a certain threshold, which was determined to be $n_e \cong 1.39 \times 10^{11}/(dR)$ cm$^{-3}$ (where d is half of the plasma width in mm, and R is the radius of the electrode in meters). In typical PECVD film deposition processes, $n_e \leqq 10^9$/cm$^3$. Therefore, this criterion is satisfied for most PECVD chambers, even for the larger rectangular substrates where the equivalent R (the half diagonal dimension of the substrate) is equivalent to 1.39 meters, and half-width of the plasma, d, is about 10 millimeters. Therefore, the non-uniform RF surface wave skin effects are generally negligible in a PECVD process scale up.

The most important of the plasma surface wave effects are surface standing wave effects, which become significant when the total substrate surface area increases beyond about 1 square meter. Surface standing wave effects can have a significant effect on the uniformity of film thickness and other film properties across the substrate surface.

FIG. 7A is a graph 700 showing the effect of surface standing waves on the deposition rate 702 of PECVD-deposited silicon nitride film. Curve 706 is data from measurements taken across one diagonal of a rectangular substrate, while curve 708 is data from measurements taken across the other diagonal of the rectangular substrate. The data shown in graph 700 represents the deposition rate in Å/min as a function of the distance of travel along the diagonal across the substrate surface from edge to edge in mm. This data is for a substrate having rectangular dimensions of 1500 mm×1850 mm. and the graph shows data for one diagonal on curve 706 and data for the other diagonal on curve 708, but plotted on axis 704 based on travel along the 1850 mm dimension of the substrate. A non-uniform deposition rate across the substrate surface is directly proportional to film thickness non-uniformity (and may also involve non-uniformity of other film properties across the substrate surface).

There is presently a need for a process which minimizes surface standing wave effects during PECVD deposition of thin films over substrate surface areas where the equivalent radius R (the half diagonal of a rectangular-shaped substrate) exceeds about 0.7 meters.

SUMMARY OF THE INVENTION

We have discovered and further developed a methods of PECVD depositing a-SiN$_x$:H and a-Si films which are useful in the manufacture of TFT structures having surface areas larger than about 2,000 mm×2,500 mm, where the uniformity of the film thickness and uniformity of film properties, including chemical composition, is surprisingly consistent. In particular, the film deposition rate is typically greater than 1000 Å/min, and frequently more than about 2,000 Å/min. With respect to an a-SiN$_x$:H film, the Si—H bonded content of the a-SiN$_x$:H film is controlled to be less than about 15 atomic %; the film stress ranges from about 0 to about $-10^{10}$ dynes/cm$^2$; the film thickness across the substrate surface area varies by less than about 17%; the refractive index (RI) of the film ranges from about 1.85 to about 1.95; and, the wet etch rate in HF solution (which is an indication of film density) is less than 800 Å/min. The HF solution is one referred to in the industry as "Buffer Oxide Etchant 6:1", which contains 7% by weight hydrofluoric acid, 34% by weight ammonium fluoride, and 59% by weight water. The wet etching test is carried out at a substrate temperature of about 25° C. In addition, the chemical composition of the film, in terms of Si—H bonded content, is consistently below the 15 atomic % maximum preferred.

An a-SiN$_x$:H gate dielectric film exhibiting the physical characteristics listed above provides excellent performance capabilities, and the uniformity of the film across the substrate enables the production of flat panel displays having dimensions in the range of 1900 mm×2200 mm, and possibly even larger.

In a previous effort to obtain a uniform distribution across a substrate having the dimensions of 1200 mm×1300 mm, while providing an a-SiN$_x$:H gate dielectric film exhibiting a low threshold voltage (low hydrogen content), we used a precursor source gas (precursor gas mixture) having a NH$_3$:SiH4 ratio ranging from 3.1 to 8.6, a N$_2$:SiH$_4$ ratio ranging from 10.0 to 35.8, and a N$_2$:NH$_3$ ratio ranging from 2.4 to 10.0. A nitrogen content at this level did not cause a problem with film uniformity in terms of thickness and properties, including chemical composition across the substrate. However, we discovered that when the substrate size was increased to dimensions of 1500 mm to 1800 mm, this precursor source gas produced a non-uniform film thickness which varied by as much as about 25%; produced film structures where the Si—H bonded content exceeded 23 atomic %; and, produced films where the wet etch rate in HF solution (normalized to thermal oxide 1000 Å/min) exceeded 2400 Å/min in some instances. Based on our earlier experience, the nitrogen content of the precursor source gas needed to be reduced to produce a more uniform film thickness across the substrate.

We were surprised to discover that by increasing the NH$_3$:SiH$_4$ ratio to range between 5.3 to 10.0, while decreasing the N$_2$:SiH$_4$ ratio to range between 5.5 and 18.7, and decreasing the spacing between electrodes by an amount between about 20% and 50% from the baseline 1000 mils, we were able to deposit an a-SiN$_x$:H dielectric film with a film thickness which varied by less than about 16% over the substrate surface, while maintaining an Si—H bonded content in the film of less than 15 atomic %. The N$_2$:NH$_3$ ratio which provided excellent results ranged from about 0.6 to about 2.5, preferably 0.6 to about 2.3, which compared with the previous N$_2$:NH$_3$ ratio of 2.4 to 10. We also maintained a wet etch rate below about 800 Å/min over the a-SiN$_x$:H dielectric film surface using the new precursor source gas composition.

The critical requirement for deposition of an a-SiN$_x$:H dielectric film used as a passivation layer is that the substrate temperature during deposition of the passivation layer is less than about 300° C., to prevent damage to TFT channel ion migration characteristics and to reduce damage to the source/drain (S/D) metal as well. With this in mind, the passivation layer is deposited at a substrate temperature ranging between about 150° C. and about 300° C., and preferably between about 260° C. and 280° C. The general requirement in the industry for performance of the passivation layer is that the breakdown voltage not fall below about 5 MV/cm. The step coverage of the a-SiN$_x$:H dielectric film used as a passivation layer needs to be better than for the gate dielectric film, to provide conformality over the S/D channel regions of the TFT device. The mechanical properties of the passivation layer are also important. For example, film stress for the passivation layer should be lower than for a gate dielectric layer. The film stress for the passivation layer should range between about +3×10$^{10}$ dynes/cm$^2$ to about −3×10$^{10}$ dynes/cm$^2$. Due to the decrease in deposition temperature, the wet etch rate of the deposited film typically increases (the density of the film decreases). One skilled in the art will need to balance the change in breakdown voltage, step coverage, and mechanical properties against other changes in device structure and properties to determine the best substrate temperature for deposition, based on the device performance requirements.

The combination process parameters required to produce the a-SiN$_x$:H gate dielectric film having the properties and uniformity described above include the following: a substrate temperature during film deposition ranging from about 120° C. to about 360° C. in general, and from about 320° C. to about 355° C. when the substrate is glass;

a process pressure of less than about 2.0 Torr, and typically ranging from about 0.7 Torr to about 1.5 Torr at the substrate surface;

a power density ranging between about 0.2 W/cm$^2$ and about 0.6 W/cm$^2$;

a plasma precuersor gas mixture in which the precursors gases include N$_2$, NH$_3$, nd SiH$_4$, and where the component ratios are: NH$_3$ : SiH$_4$ ranging from about 5.3 to about 10.0, N$_2$ : SiH$_4$ ranging from about 5.5 to about 18.7, and N$_2$ : NH$_3$ ranging from about 0.6 to about 2.3, and typically from about 0.6 to about 1.9;

an electrode spacing in the PECVD process chamber which ranges from about 400 mm to about 1000 mm, depending on the substrate size, so that the requirements are met for providing film deposition uniformity and film property requirements;

a total precursor gas flow rate which is appropriate to maintain the desired residence time of reactive species in the processing volume of the substrate.

When the PECVD processing chamber is a parallel plate processing chamber, such as an AKT™ PECVD 25KA System (of the kind used to carry out the experimentation presented in the Examples herein), the electrode spacing should be less than about 1000 mils (1 mil≈0.001 inch), and typically ranges between about 800 mils and 400 mils. In addition, the total precursor gas flow rate should range from about 20,000 sccm to about 70,000 sccm.

One skilled in the art, after having read the disclosure provided herein, can make the calculations necessary to provide an equivalent electrode spacing and precursor gas flow rate, for example and not by way of limitation, when the plasma processing chamber is different from the processing chamber specified above (which is described in more detail subsequently herein).

The combination process parameters required to produce an a-SiN$_x$:H passivation dielectric film are different from those required to produce a gate dielectric film. This is because the desired performance properties of the passivation dielectric layer are different, and because the device surface upon which the passivation dielectric layer is deposited is far more sensitive to substrate temperature at the time of film deposition of the passivation dielectric layer. For example, the important performance characteristics of the passivation dielectric layer are not ion mobility and voltage threshold (as for the gate dielectric film), but are, instead, breakdown voltage, step coverage, and mechanical properties (such as residual film stress). An acceptable passivation layer may exhibit, for example, a WER of 5000 Å/min or higher and a S—H bonded structure content of 20% or higher, and still be acceptable. With respect to the ratios of precursor gases used for PECVD of a passivation layer of a-SiN$_x$:H, the ratio of NH$_3$:SiH$_4$ may easily range, for example and not by way of limitation, from about 5.6 to about 11.1, typically from about 5.6 to about 10.6. The ratio of N$_2$:SiH$_4$ may range, for example and not by way of limitation, from about 5.8 to about 20.8, and typically from about 5.8 to about 19.9. The ratio of N$_2$:NH$_3$ may range, for example and not by way of limitation, from about 0.4 to about 2.3, and typically from about 0.6 to about 1.9.

We have also discovered relationships between process variables, control of which can be used to improve film deposition uniformity across large substrates (of the kind described herein) during the PECVD deposition of silicon-containing thin films. The method is particularly useful when the substrate surface equivalent radius is about 0.7 meter or greater. Proper control of these process variables provides a reduction in surface standing wave effects (and, hence, uniformity of film thickness and other film properties) across a substrate surface. The process variables which can be adjusted in combination to reduce standing wave effects include: The width of a plasma sheath relative to the plasma width (where a relative increase in plasma sheath width tends to reduce standing wave effects); the RF frequency of the plasma source power (where a reduction in frequency tends to reduce standing wave effects); the amount of RF power applied to the plasma source (source gases) (where a reduction in the amount of power tends to reduce standing wave effects); the process chamber pressure (where a reduction in process chamber pressure tends to reduce standing wave effects); and the composition of the plasma source gases (where an increase in NH$_3$ flow rate relative to N$_2$ flow rate during the formation of an a-SiN$_x$:H film is beneficial in reducing standing wave effects), for example.

The width of the plasma sheath can be increased, for example (and not by way of limitation), by decreasing the spacing between the upper and lower electrodes in a parallel plate processing chamber.

When the PECVD processing chamber is a parallel plate processing chamber, such as an AKT™ PECVD 25KA System (of the kind used to carry out the experimentation presented in the Examples herein), the electrode spacing should be less than about 1000 mils, and typically ranges between about 400 mils about 800 mils. The RF power frequency should range between about 13.56 and about 7 MHz, and may be lower; however a frequency of 2 MHz and lower is known to cause film roughness due to ion bombardment. The process chamber pressure should range between about 0.5 Torr and about 1.5 mTorr (more typically, within the range of about 0.7 Torr to about 1.0 Torr). The amount of RF power applied to the plasma source gas per substrate surface area should range from about 0.2 W/cm$^2$ to about 0.6 W/cm$^2$. In addition, the total precursor gas flow rate should range from about 20,000 sccm to about 70,000 sccm. This provides a chamber volume turnover ranging from about 0.02/min to about 0.07/min. Our recommendation is that the gas flow rate be such that a chamber volume turnover of about 0.015 or greater is achieved. With respect to the deposition of an a-SiN$_x$:H film, the concentration of NH$_3$ in the plasma source gas mixture should be such that the ratio of NH3:SiH$_4$ should range from about 2:1 to about 15:1, and the ratio of NH$_3$:N$_2$ should range from about 0.3:1 to about 2:1. One skilled in the art, upon reading this disclosure, can calculate an equivalent electrode spacing, amount of RF power applied to the plasma source gases, and the total precursor gas flow rate when the plasma processing chamber is different from the processing chamber specified above.

As mentioned above, a reduction in the RF power to the plasma source to within the range of about 0.2 W/cm$^2$ to about 0.6 W/cm$^2$ can aid in improving film thickness uniformity. Although a decrease in RF power also decreases the film deposition rate, we have found, that for a silicon-containing PECVD deposited film, this range of RF power typically provides an acceptable film deposition rate of at least 1,000 Å/min, by way of example and not by way of limitation).

The PECVD process parameters described above, when used in combination, provide better control over surface standing wave effects and film thickness uniformity for silicon-containing films such as silicon nitride and silicon oxide. Our initial indications are that PECVD-deposited a-silicon films are not as significantly affected by standing wave effects.

BRIEF DESCRIPTION OF THE DRAWINGS

FIG. 7A represents film uniformity available prior to the present invention and is a comparative example. FIGS. 7B and 7C represent film uniformity available after the present invention.

DETAILED DESCRIPTION OF EXEMPLARY EMBODIMENTS

Figure 1:
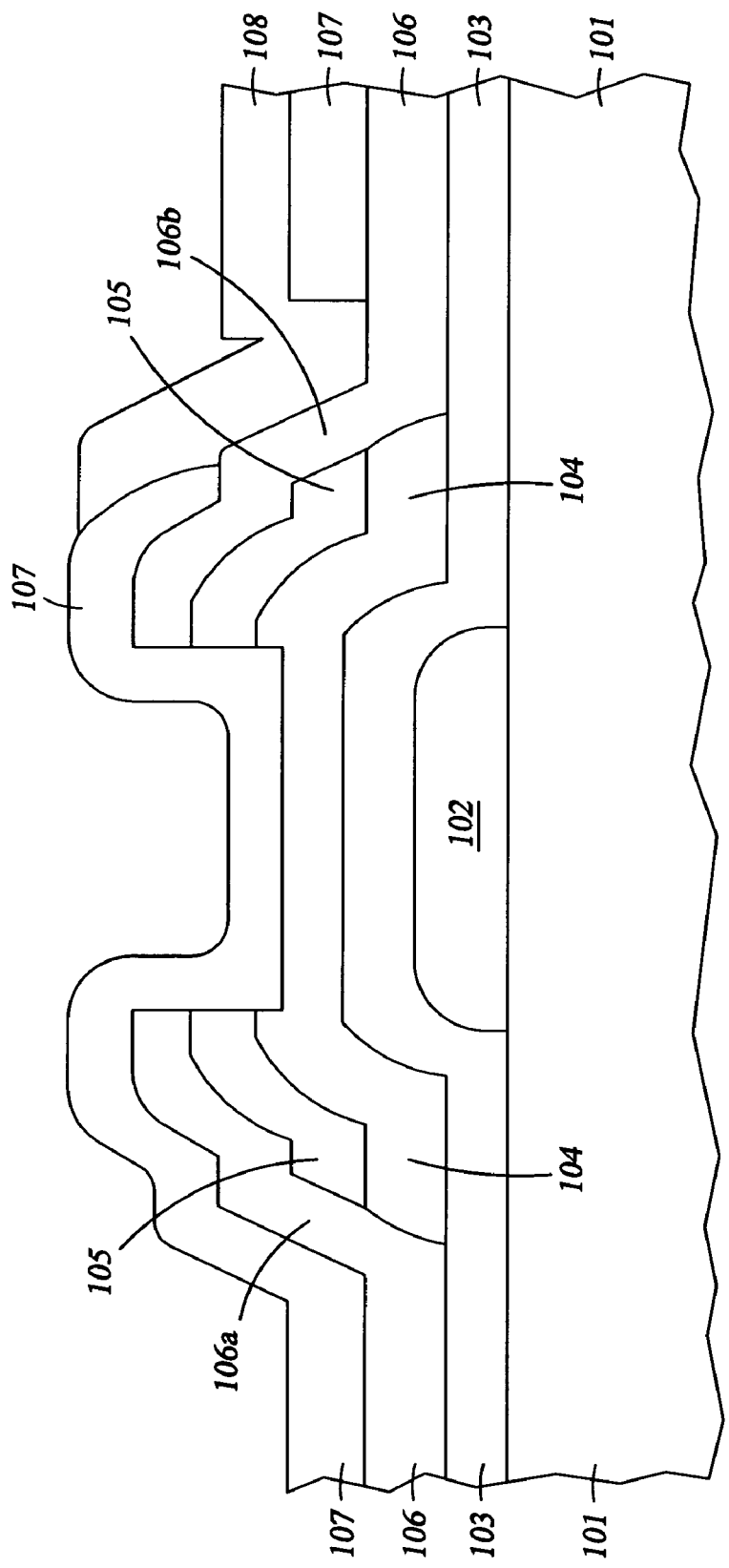
FIG. 1 shows a schematic cross-sectional view of one embodiment of a TFT device of the kind which employs the a-SiN$_x$:H gate and passivation dielectric films of the present invention.

As a preface to the detailed description presented below, it should be noted that, as used in this specification and the appended claims, the singular forms "a", "an" and "the" include plural referents, unless the context clearly dictates otherwise.

We have developed a method of PECVD depositing silicon-containing films, and particularly valuable a-SiN$_x$:H films which are useful in a TFT device as gate dielectric and passivation layers. The method is especially useful when a series of TFT devices are arrayed over a substrate having a surface area larger than about 1000 mm×1000 mm, which may be as large as 1900 mm×2200 mm, and possibly even larger, up to a surface area of 9 m$^2$, for example. The a-SiN$_x$:H films provide a uniformity of film thickness and uniformity of film properties, including chemical composition, which are necessarily independent of the substrate surface areas, but difficult to produce over large surface areas.

One of the embodiments of the invention which was of great interest was the uniform deposition of an a-SiN$_x$:H film. For a PECVD precursor (plasma source) gas comprising SiH$_4$, NH$_3$ and N$_2$, we were surprised to discover that by increasing the NH$_3$:SiH$_4$ ratio to range between 5.3 to 10.0, while decreasing the N$_2$:SiH$_4$ ratio to range between 5.5 and 18.7, and decreasing the spacing between electrodes by an amount between about 20% and 50% from the baseline 1000 mils, we were able to produce an a-SiN$_x$:H film which functioned well as a TFT gate dielectric. The film exhibited a thickness which varied by less than about 16% over the substrate surface, while maintaining a Si—H bonded content in the film of less than 15 atomic %. We also maintained a wet etch rate of the a-SiN$_x$:H deposited film below about 800 Å/min. The N$_2$:NH$_3$ ratio which provided excellent results ranged from about 0.6 to about 2.5, preferably 0.6 to 2.3, which compared with the previous N$_2$:NH$_3$ ratio of 2.4 to 10.

In addition to developing a method of producing an a-SiN$_x$:H dielectric film which functions well as a TFT gate dielectric, we developed an a-SiN$_x$:H dielectric film which functions well as a passivation layer overlying the upper conductive electrode of the TFT device. The critical requirement for deposition of an a-SiN$_x$:H passivation dielectric layer is that the substrate temperature during deposition is less than about 300° C. (on a glass substrate), to prevent damage to TFT channel ion migration characteristics and to reduce damage to the source/drain (S/D) metal as well. With this in mind, the passivation layer is deposited at a substrate temperature ranging between about 150° C. and about 300° C., and preferably between about 260° C. and 280° C. The general requirement for performance of the passivation layer is that the breakdown voltage not fall below about 5 MV/cm. The step coverage of the a-SiN$_x$:H dielectric passivation layer needs to be better than for the gate dielectric film, to provide conformality over the S/D channel regions of the TFT device.

The mechanical properties of the passivation layer are also important. For example, the film stress for the passivation layer should range between about +3×10$^{10}$ to about −3×10$^{10}$. Due to the decrease in deposition temperature, the wet etch rate of the deposited film typically increases (the density of the film decreases). One skilled in the art will need to balance the change in breakdown voltage, step coverage, and mechanical properties against other changes in device structure and properties to determine the best substrate temperature for deposition, based on the device performance requirements.

We subsequently developed a method of PECVD depositing a silicon-containing thin film (such as a-Si or a-SiN$_x$:H film, by way of example and not by way of limitation) which provides improved control over surface standing wave effects during film deposition. The method involves controlling a combination of PECVD deposition process parameters. Although several of the examples described below pertain primarily to the deposition of silicon nitride films, the same process parameters can be manipulated in order to provide improved film uniformity during PECVD deposition of other silicon-containing thin films, such as silicon oxide, silicon oxynitride, a-Si, and doped a-Si (for example and not by way of limitation). This is illustrated by the close similarity of effect when an a-Si film is deposited by PECVD using the same process conditions. Proper control of these process variables provides a reduction in surface standing wave effects (and, hence, uniformity of film thickness and other film properties) across a substrate surface.

The PECVD deposition process parameters which we have found to affect surface standing wave effects include: The width of a plasma sheath relative to the plasma width (where an increase in the sheath width relative to the plasma width tends to reduce standing wave effects); the RF frequency of the plasma source power (where a reduction in frequency tends to reduce standing wave effects); the amount of RF power applied to the plasma source (source gases) (where a reduction in the amount of power tends to reduce standing wave effects); the process chamber pressure (where a reduction in process chamber pressure tends to reduce standing wave effects); and the composition of the plasma source gases (where an increase in NH$_3$ flow rate relative to N$_2$ flow rate during the formation of an a-SiN$_x$:H film is beneficial in reducing standing wave effects), for example.

An increase in the width of the plasma sheath, which is one of the major factors which improves uniform film deposition, can be achieved, for example (and not by way of limitation), by decreasing the spacing between the upper and lower electrodes in a parallel plate processing chamber. Typically, the sheath width should be about 20 mils or greater.

When the PECVD processing chamber is a parallel plate processing chamber, such as an AKT™ PECVD 25KA System (Santa Clara, Calif.), which was used for experimental work described herein, the electrode spacing should be less than about 1000 mils, and typically ranges between about 400 mils and about 800 mils. The RF power frequency should range between about 13.56 and about 7 MHz, and may be lower; however a frequency of 2 MHz and lower is known to cause film roughness due to ion bombardment. The process chamber pressure should range between about 0.5 Torr and about 1.5 mTorr (more typically, within the range of about 0.7 Torr to about 1.0 Torr). The amount of RF power/substrate surface area applied to the plasma source gas should range from about 0.2 W/cm$^2$ to about 0.6 W/cm$^2$. In addition, the total precursor gas flow rate should range from about 20,000 sccm to about 70,000 sccm. With respect to the deposition of an a-SiNx:H film, the concentration of NH$_3$ in the plasma source gas mixture should be such that the ratio of NH3:SiH$_4$ should range from about 2:1 to about 15:1, and the ratio of NH$_3$:N$_2$ should range from about 0.3:1 to about 2:1. As previously discussed herein, one skilled in the art can calculate an equivalent electrode spacing, amount of RF power applied to the plasma source gases, and the total precursor gas flow rate when the plasma processing chamber is different from the processing chamber specified above.

Figures 5A, 5B:
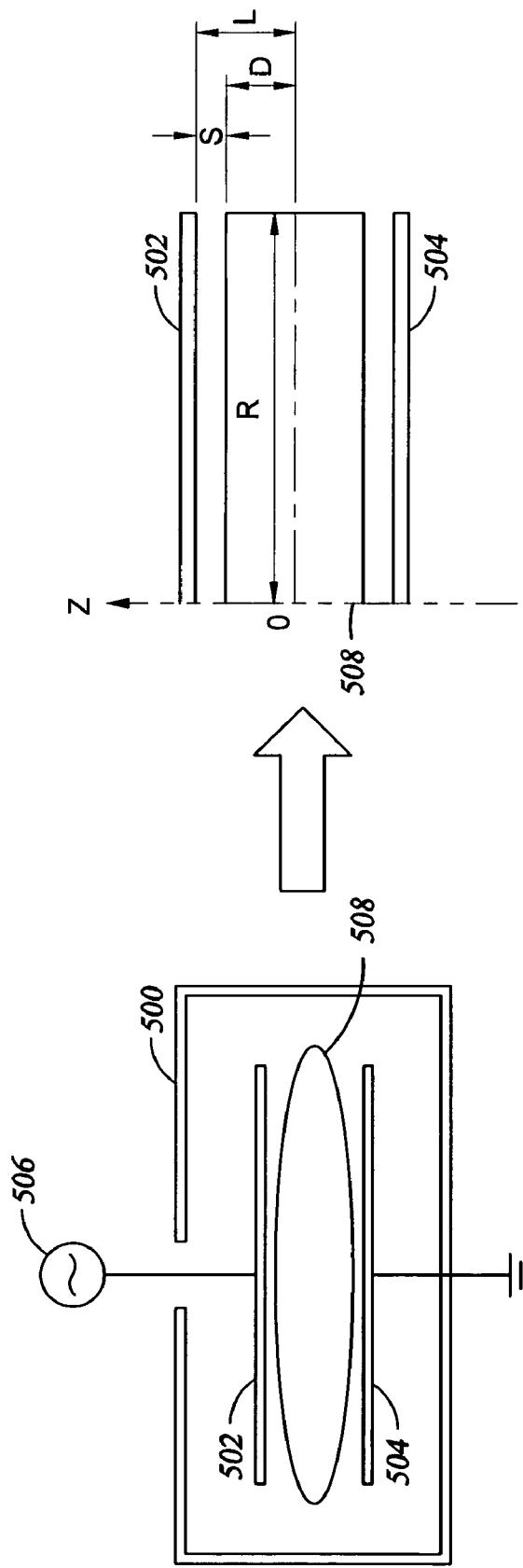
FIG. 5A is a cross-sectional schematic of a cylindrical parallel plate, capacitively coupled reactor.
FIG. 5B is a cross-sectional view of the reactor shown in FIG. 5A, taken from the center of the plasma region toward the edge (from the electrode center toward the edge of the electrode).

Referring again to FIG. 5B, a smaller electrode spacing (2 L) and a larger plasma sheath have been shown to reduce surface standing wave effects. Closer electrode spacing combined with an increased plasma sheath width (affected by power density, reactants concentration and ratio, process chamber pressure, for example) effectively modify the plasma boundary conditions, thereby minimizing the non-uniformity of PECVD-deposited films.

When the PECVD processing chamber is a parallel plate processing chamber where the substrate surface area processed may be about 25,000 cm$^2$ to about 30,000 cm$^2$, such as the processing chamber used for processing the example substrates described herein, the electrode spacing was typically in the range from about 400 mils to about 800 mils. The sheath width "s" was about 20 mils or greater. In addition, the total precursor gas flow rate ranged from about 20,000 sccm to about 70,000 sccm, which typically provides a chamber precursor gas turnover ranging from about 0.015/min to about 0.07/min. One skilled in the art, upon reading the disclosure herein can calculate an equivalent electrode spacing and precursor gas flow rate when the plasma processing chamber is different from the processing chamber discussed herein.

As discussed in the "Background of the Invention", surface standing wave effects become significant when the total substrate surface area increases beyond about 1 square meter. Referring back to FIG. 5B, the criterion for avoiding significant surface standing wave effects is:

$$\lambda_0 \gg 2.6(L/s)^{1/2}R$$

where $\lambda_0$ is the RF free space wavelength, L is the half-spacing between the electrodes (in millimeters), s is the width of the plasma sheath (in millimeters), and R is the equivalent radius of the electrode (in meters). Table One, below, shows the wavelengths, $\lambda_0$, associated with various RF frequencies.

TABLE ONE

Wavelengths ($\lambda_0$) Associated with Various RF Frequencies

| RF Frequency (MHz) | Wavelength ($\lambda_0$) |
|---|---|
| 13.56 | 22.11 |
| 27.12 | 11.05 |
| 40.7 | 7.37 |
| 60 | 5 |
| 81.38 | 3.68 |

Table Two, below, shows the values of 2.6 (L/s)$^{1/2}$ R for various substrate sizes.

TABLE TWO 2.6 (L/s)$^{1/2}$ R for Various Substrate Sizes

| Substrate Size (mm) | R, equivalent, (m) | 2.6 (L/s)$^{1/2}$ R |
|---|---|---|
| 1100 × 1250 | 0.83 | 5.6 |
| 1500 × 1850 | 1.19 | 8 |
| 1870 × 2200 | 1.44 | 9.7 |

Where 2L = 800 mils, that is 20 mm; s = 1.5 mm

As the substrate size increases, the value of $\lambda_0$ needs to increase, to meet the requirement for avoiding significant surface standing wave effects. With this in mind, we carried out the experimentation described herein using an RF frequency of 13.56 MHz. As previously discussed, we have found that reducing the RF frequency as low as 7 MHz (and possibly lower) can aid in controlling standing wave effects during PECVD thin film deposition.

We have also found that, during deposition of a silicon-containing film, reducing the RF power/substrate area which is applied to the plasma source so that it is within the range of about 0.2 W/cm$^2$ to about 0.6 W/cm$^2$ can aid in improving film thickness uniformity, while maintaining an acceptable film deposition rate of at least 1000 Å/min.

Reducing the process chamber pressure to within the range of about 0.7 Torr to about 1.5 Torr (more typically, within the range of about 0.7 Torr to about 1.0 Torr) at the substrate surface also provides beneficial effects in terms of minimizing surface standing wave effects.

The PECVD process parameters described above, when used in combination, provide better control over surface standing wave effects and film thickness uniformity than was previously achievable.

I. APPARATUS FOR PRACTICING THE INVENTION

Figure 2A:
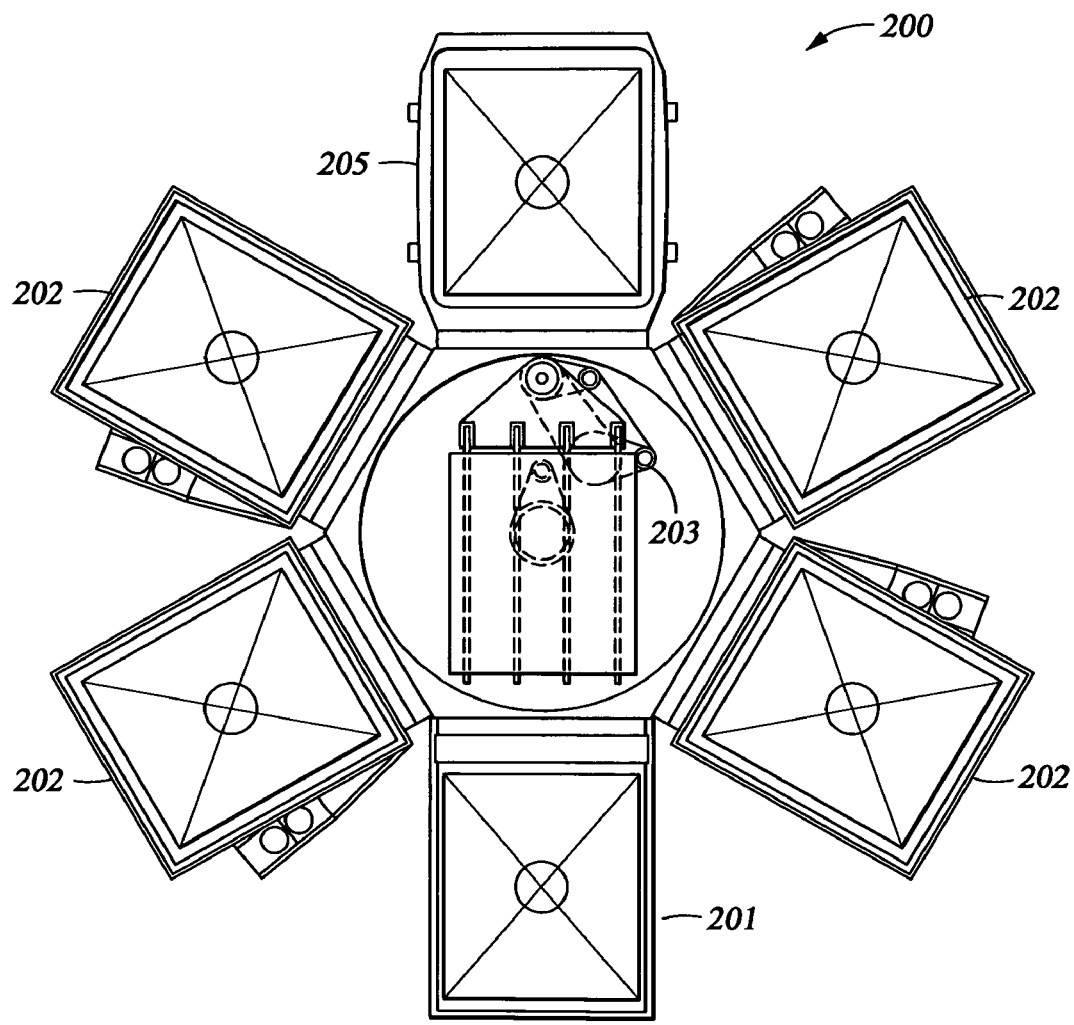
FIG. 2A is a schematic of a top view of a PECVD processing system of the kind which can be used to deposit the films of the present invention.

The embodiment example PECVD processes described herein were carried out in a parallel plate processing chamber, the AKT™ PECVD 25 KA System, available from AKT™, a division of Applied Materials, Inc., Santa Clara, Calif. Referring to FIG. 2A, the system 200 generally includes a loadlock chamber 201 for loading substrates (not shown) into the system; a robot assembly 203 for transferring substrates between chambers in the system; four PECVD processing chambers 202; and an optional substrate heater 205. The AKT™ PECVD 25 KA System is also available with a fifth PECVD processing chamber in place of substrate heater 205.

Figure 2B:
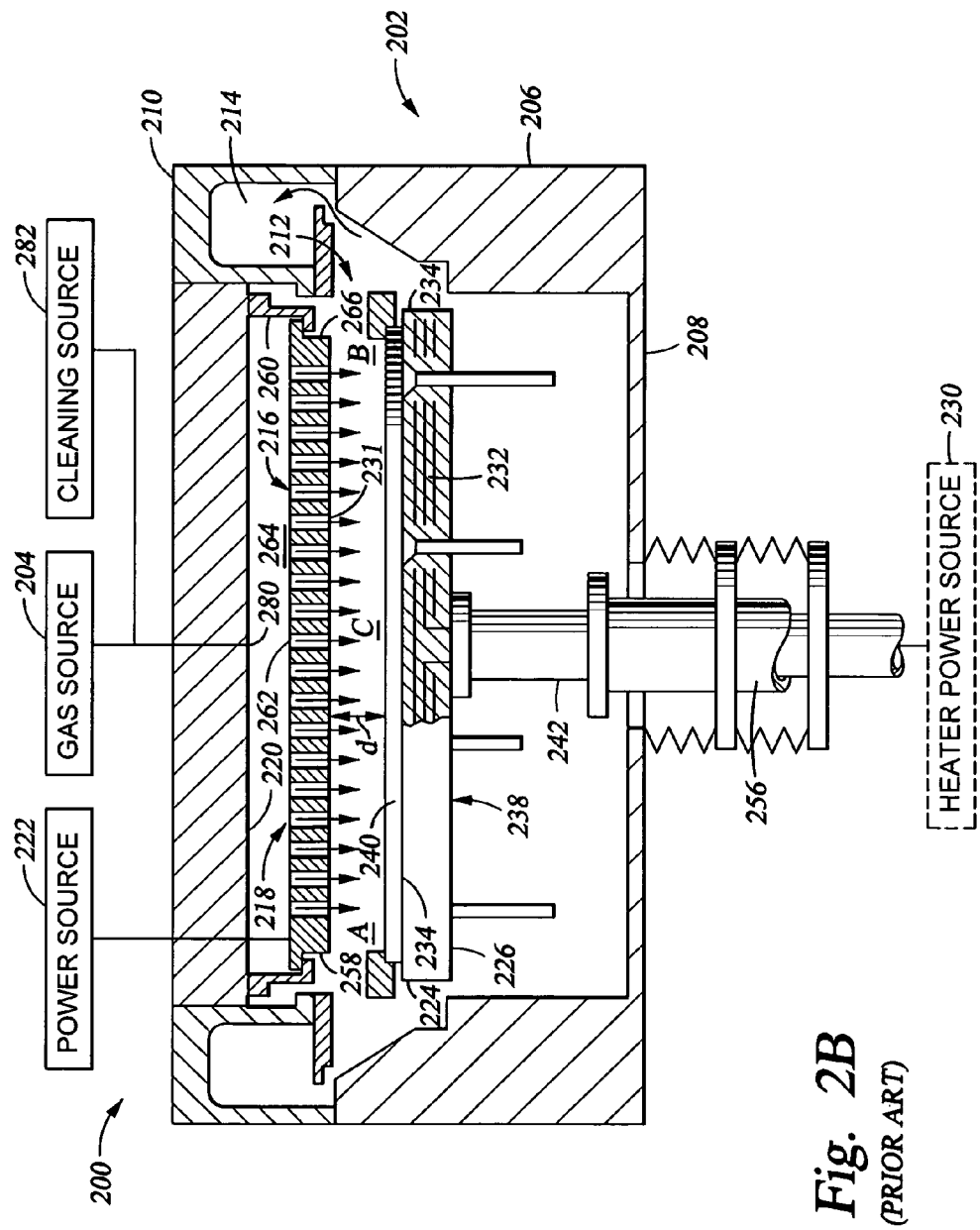
FIG. 2B is a schematic of a side view of a PECVD processing chamber of the kind which can be used to deposit the films of the present invention.

Referring to FIG. 2B, each processing chamber 202 is typically coupled to a gas source 204. The processing chamber 202 has walls 206 and a bottom 208 that partially define a processing volume 212. The processing volume 212 is typically accessed through a port (not shown) in the walls 206 that facilitate movement of a substrate 240 into and out of processing chamber 202. The walls 206 support a lid assembly 210 that contains a pumping plenum 214 that couples the processing volume 212 to an exhaust port (that includes various pumping components, not shown).

A temperature controlled substrate support assembly 238 is centrally disposed within the processing chamber 202. The substrate support assembly 238 supports the glass (for example, but not by way of limitation) substrate 240 during processing. The substrate support assembly 238 typically encapsulates at least one embedded heater 232, such as a resistive element. The heater element 232 is coupled to a power source 230 which is controlled to heat the substrate support assembly 238 and the substrate 240 positioned thereon. Typically, in a CVD process, the heater maintains the substrate 240 at a uniform temperature between about 120° C. and 460° C., depending on the processing parameters required for the particular substrate.

Generally, the substrate support assembly 238 has a lower side 226 and an upper side 234. The upper side 234 supports the glass substrate 240. The lower side 226 has a stem 242 coupled thereto. The stem 242 couples the substrate support assembly 238 to a lift system (not shown) that moves the support assembly 238 between an elevated processing position (as shown) and a lowered position that facilitates substrate transfer to and from the processing chamber 202. The stem 242 additionally provides a conduit for electrical and thermocouple leads between the substrate support assembly 238 and other components of the system 200.

The substrate support assembly 238 is generally grounded such that RF power supplied by a power source 222 to a gas distribution plate assembly 218 positioned between the lid assembly 210 and the substrate support assembly 238 (or other electrode positioned within or near the lid assembly of the chamber) may excite gases present in the processing volume 212 between the substrate support assembly 238 and the distribution plate assembly 218. The RF power from the power source 222 is generally selected commensurate with the size of the substrate, to drive the chemical vapor deposition process. The distance "d" illustrates the spacing between the upper surface 234 of substrate support assembly 238 and the lower surface 231 of distribution plate assembly 218. This is also the spacing between electrode surfaces, since distribution plate 218 acts as a first electrode, while substrate support 238 acts as the second electrode. The spacing "d", in combination with the thickness of the substrate 240, substantially determines the processing volume 212. The spacing "d" (which is equivalent to 2 L in FIG. 5B) can be adjusted as necessary to provide the desired processing conditions.

The lid assembly 210 typically includes an entry port 280 through which process gases provided by the gas source 204 are introduced into processing chamber 202. The entry port 280 is also coupled to a cleaning source 282. The cleaning source 282 typically provides a cleaning agent, such as disassociated fluorine, that is introduced into the processing chamber 202 to remove deposition by-products and films from processing chamber hardware.

The gas distribution plate assembly 218 is coupled to an interior side 220 of the lid assembly 210. The gas distribution plate assembly 218 is typically configured to substantially follow the profile of the substrate 240, for example, polygonal for large area substrates and circular for wafers. The gas distribution plate assembly 218 includes a perforated area 216 through which process and other gases supplied from the gas source 204 are delivered to the processing volume 212. The perforated area 216 of the gas distribution plate assembly 218 is typically configured to provide uniform distribution of gases passing through the gas distribution plate assembly 218 into the processing chamber 202.

The gas distribution plate assembly 218 typically includes a diffuser plate 258 suspended from a hanger plate 260. The diffuser plate 258 and hanger plate 260 may alternatively comprise a single unitary member. A plurality of gas passages 262 are formed through the diffuser plate 258 to allow a predetermined distribution of a precursor source gas passing through the gas distribution plate assembly 218 and into the processing volume 212. The hanger plate 260 maintains the diffuser plate 258 and the interior surface 220 of the lid assembly in a spaced-apart relation, thus defining a plenum 264 therebetween. The plenum 264 allows gases flowing through the lid assembly 210 to uniformly distribute across the width of the diffuser plate 258 so that gas is provided uniformly above the center perforated area 216 and flows with a uniform distribution through gas passages 262.

Figure 6:
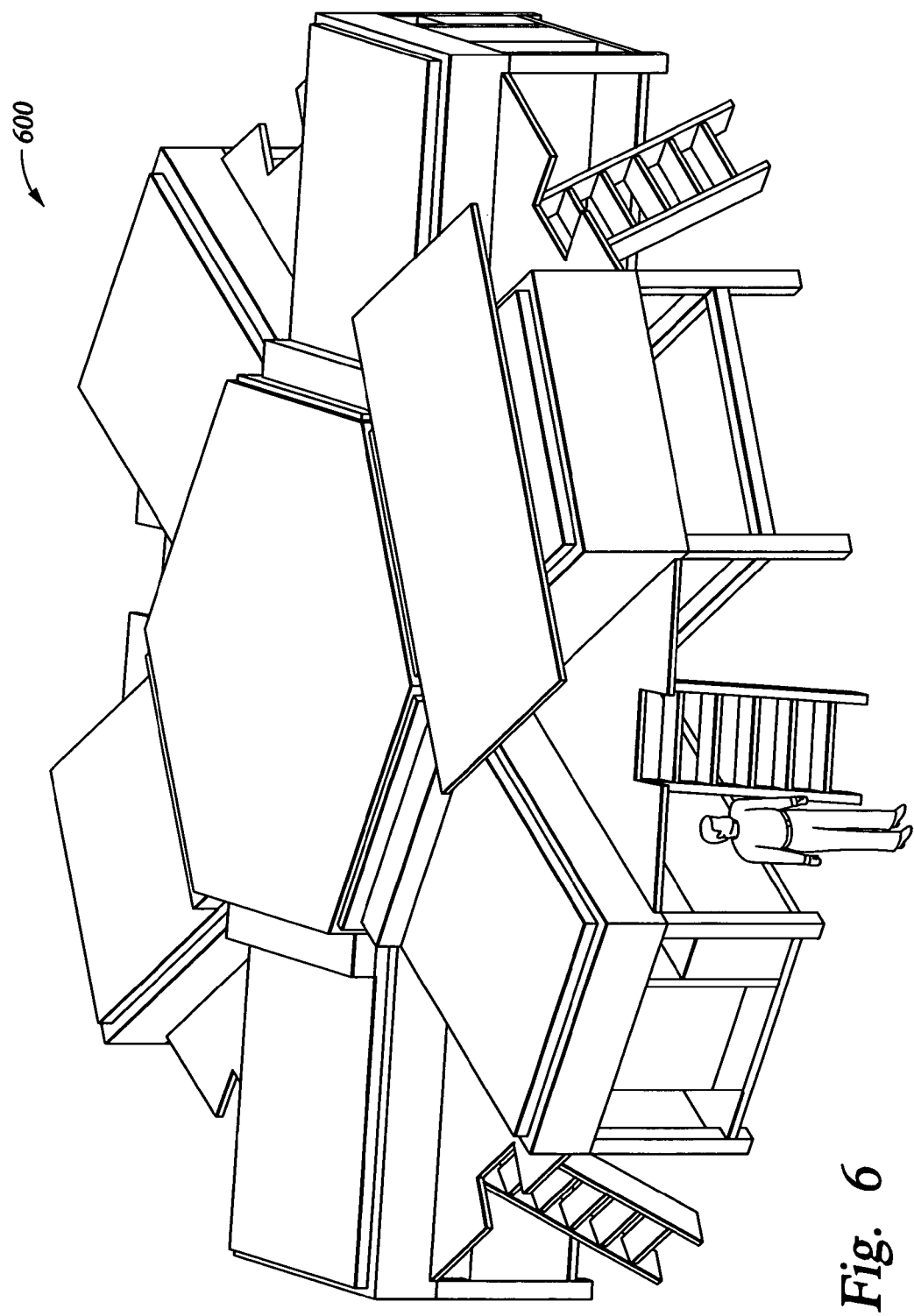
FIG. 6 shows a perspective view of a PECVD processing system of the kind which can be used to deposit thin films on large surface area substrates, in accordance with the method of the present invention. This figure is provided to better illustrate the size of the apparatus which is required to process substrates of the dimension described herein.

FIG. 6 shows a perspective view of a PECVD processing system 600 of the kind which can be used to deposit thin films on large surface area substrates, in accordance with the method of the present invention. This figure is presented to emphasize the size of the apparatus necessary to produce substrates of the dimension described herein, as this makes it clear why depositing a uniform film thickness over such a large surface area is so difficult.

II. EXAMPLES

To provide a general understanding of the relationship of the PECVD deposited a-SiN$_x$:H gate dielectric film and the a-SiN$_x$:H passivation dielectric film relative to the other components of the TFT, a brief description of the overall fabrication process of the TFT embodiment shown in FIG. 1 is presented below.

Figures 3A, 3B:
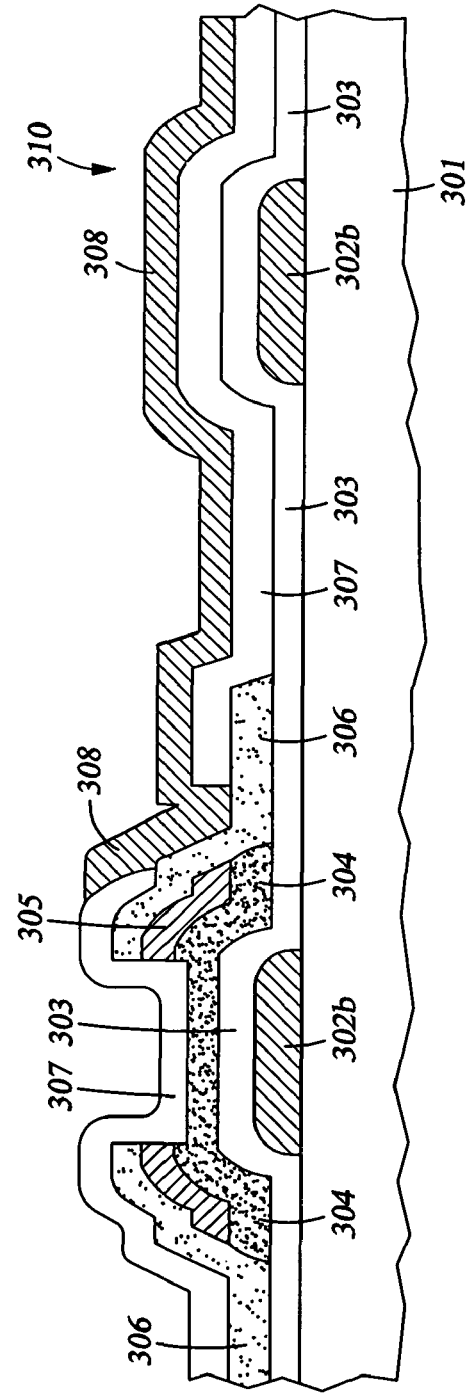
FIG. 3A shows a listing of all the steps which typically would be used to form a TFT structure of the kind shown in FIGS. 3B and 3C.
FIG. 3B shows a schematic cross-sectional view of a substrate including a TFT structure.
Figure 3C:
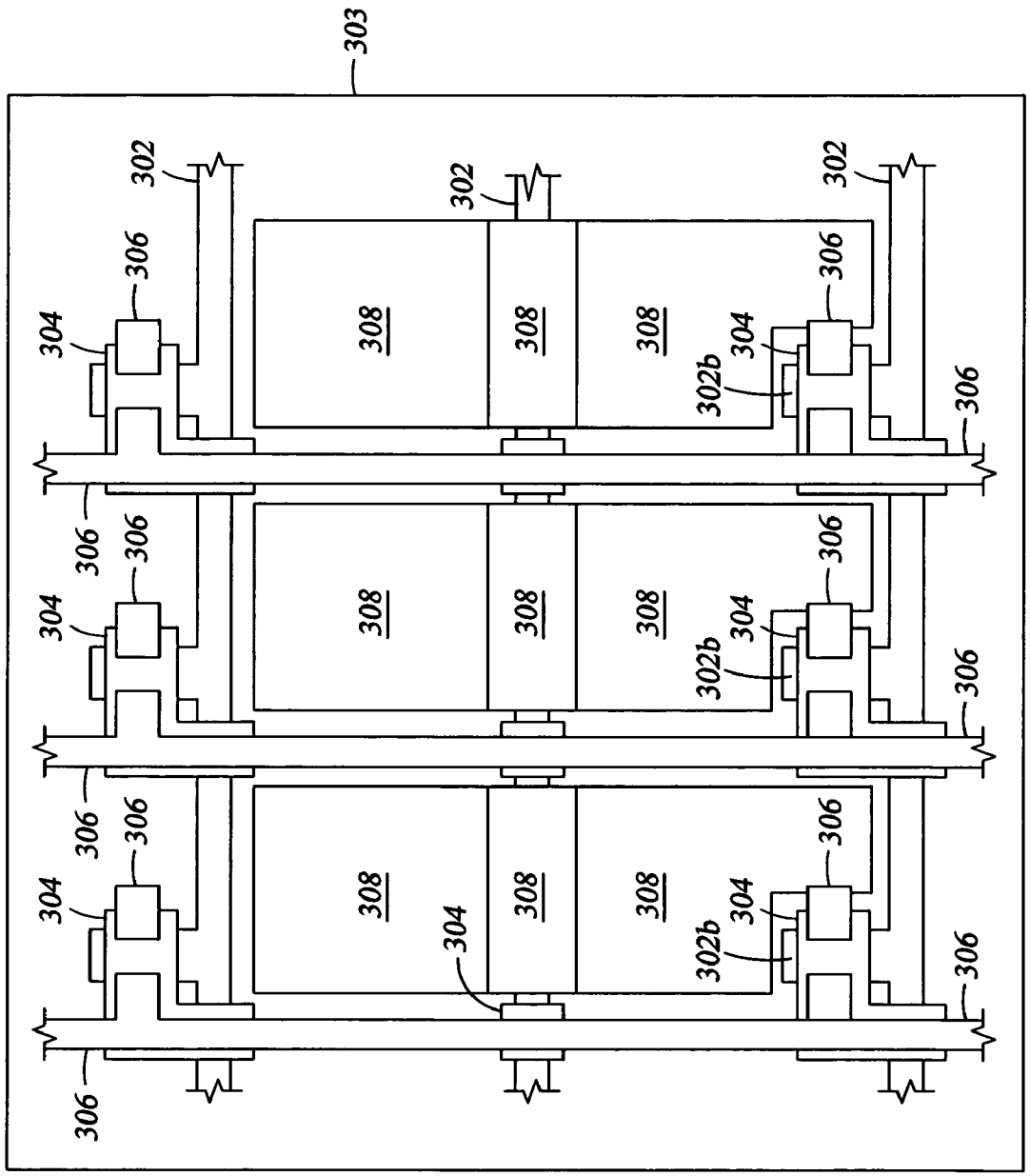
FIG. 3C shows a schematic top view of a substrate of the kind shown in FIG. 3B.

FIG. 3A show a series of process steps 300 which may be carried out to create the TFT device shown in FIGS. 3B and 3C. FIG. 3B provides a schematic cross-sectional view of a substrate including a TFT structure. FIG. 3C provides a schematic top-view 336 of a substrate including several TFT structures.

In the first step, "Gate Metal Sputtering", a conductive layer 302 is sputter deposited over a glass substrate 301 using techniques known in the art. In this particular instance, the substrate 301 is a glass substrate having a thickness of 0.7 mm. The conductive layer 302 is actually a bilayer, where the bottom portion of the layer is a chrome layer, with an overlying layer of an aluminum neodymium alloy.

In the second step, "Gate Pattern (MASK 1)", the conductive layer 302 is pattern etched using a wet etch process known in the art to provide conductive electrodes 302b.

In the third step, "n$^+$ a-Si/a-Si/a-SiN$_x$:H PECVD", a layer 303 of a-SiN$_x$:H is blanket applied by the PECVD process of the present invention, which is described in detail subsequently herein. Following the deposition of layer 303, a layer 304 of a-Si is blanket deposited using a PECVD process which is known in the art. Finally, a layer 305 of n+ doped a-Si is blanket applied by processes known in the art, including a PECVD process, to provide a conductive layer which can later become the source and drain regions for the TFT device.

In the fourth step, "a-Si Pattern (MASK 2)", layers 304 of a-Si and 305 of n+ doped a-Si are pattern dry etched, using techniques known in the art.

In the fifth step in the process, "S/D Sputtering", a blanket sputtering deposition of a chrome layer 306 is carried out using techniques known in the art. A portion of the chrome layer 306 subsequently becomes part of the source and drain regions of the TFT device.

In the sixth step, "S/D Pattern (MASK 3)", chrome layer 306 is pattern dry etched, using techniques known in the art.

In the seventh step in the process, "n$^+$ a-Si Etch-Back", the portion of the n$^+$ a-Si layer 305 which was exposed by the patterned dry etch in the sixth step is etched back using techniques known in the art. N$^+$ a-Si layer 305 is etched completely through, and is "overetched" into underlying layer 304 of a-Si.

In the eighth step in the process, "SiN$_x$:H PECVD", a passivation layer of a-SiN$_x$:H dielectric 307 is applied over the substrate surface using PECVD, according to the method of the present invention.

In the ninth process step, "Passivation Etch (MASK 4)", the passivation layer of a-SiN$_x$:H dielectric 307 is pattern dry etched, using techniques known in the art.

In the tenth process step, "ITO Sputtering", a layer 308 of indium tin oxide is blanket sputter deposited over the substrate using techniques known in the art. The indium tin oxide layer 308 is a conductive optically clear layer when sputter deposited. This optically clear conductive layer enables the use of the TFT device for display applications.

In the eleventh process step, "ITO Pattern (MASK 5)", the indium tin oxide layer 308 is pattern dry etched, using techniques known in the art, to produce a patterned conductive layer which permits addressing of individual TFT structures which are shown in a schematic top view 336.

Example One

PECVD Deposition of a-SiN$_x$:H Gate Dielectric Layers by Increasing the Concentration of NH$_3$ in the Precursor Gas Composition We have previously described all of the performance requirements for the a-SiN$_x$:H gate dielectric layer. We carried out extensive experimentation in an effort to produce a PECVD deposited a-SiN$_x$:H gate dielectric layer which met the performance requirements and which provided a uniformity in film thickness and uniformity in film properties, including structural and chemical composition, when PECVD deposited over a large surface area, larger than 1000 mm×1000 mm, for example. One basic requirement is that the a-SiN$_x$:H film deposition rate is more than 1000 Å/min, and typically more than 1300 Å/min, so that the fabrication throughput for the TFT provides adequate productivity to be economically competitive. The basic requirements for the a-SiN$_x$:H film are that: the Si—H bonded content of the a-SiN$_x$:H film is less than about 15 atomic %; the film stress ranges from about 0 to about $-10^{10}$ dynes/cm$^2$; the refractive index (RI) of the film ranges from about 1.85 to about 1.95, and, the wet etch rate in HF solution (Buffer Oxide Etchant 6:1), which WER is an indication of film density, is less than 800 Å/min. In addition, the chemical composition of the film, in terms of Si—H bonded content is consistently below the 15 atomic % maximum preferred.

In an alternative embodiment structure to that shown in FIG. 1, it is possible to deposit the a-SiN$_x$:H gate dielectric layer at a high deposition rate initially (higher than about 1300 Å/min), where the Si—H bonded content may be as high as about 20 atomic %, and then to deposit the a-SiN$_x$:H gate dielectric layer at a low deposition rate (lower than about 1300 Å/min, and typically lower than 1000 Å/min), where the Si—H bonded content is below the 15 atomic % preferred maximum. This provides a good interface between the between the a-Si layer which is subsequently deposited over the a-SiN$_x$:H gate dielectric layer. The film thickness uniformity across the substrate surface area should vary by less than about 17%. With respect to uniformity of chemical composition of the film across the substrate, it is preferred that the S—H bonded structure not vary by more than 4 atomic %. With respect to uniformity of other film properties across the wafer, it is preferred that the variation in stress be less than about $4\times10^9$ dynes/cm$^2$, and that the wet etch rate (WER), which is also an indication of density, not vary by more than 100 Å/min over the entire surface of the substrate.

Table Three, below, presents data for experimental a-SiN$_x$:H gate dielectric layer PECVD trials. This data is relative to physical properties of the a-SiN$_x$:H gate dielectric layers produced. Table Four, below, presents corresponding process parameter data for the experimental a-SiN$_x$:H gate dielectric layer films which are described in Table One. The "Run" numbers correspond. This process development was carried out in an AKT™ 25 KA PECVD System of the kind previously described herein (and represented in FIGS. 2A and 2B). Examples 1-6 are illustrative of deposited films which did not meet the target for the a-SiN$_x$:H gate dielectric layer which is to interface with an overlying a-Si layer. Examples 7-11 are illustrative of films which did meet the target.

TABLE THREE

Properties of the a-SiN$_x$:H Gate Dielectric Film Deposited by PECVD

| Run No. | Chamber Near Window Side "A" | Chamber Near Center "C" | Chamber Near Slit Valve Side "D" | Maximum Difference | D/R Å/min | Variation in Film Thickness Uniformity, % (excluding 15 mm from edge of substrate) |
|---|---|---|---|---|---|---|
| 1 | | | | | 2015 | 13.2 |
| Thickness Å | 5991 | 5922 | 5895 | 96 | | |
| RI | 1.89 | 1.89 | 1.87 | 0.02 | | |
| Stress* ×10$^9$ dynes/cm$^2$ | 4 | +1.8 | +3.1 | 2.3 | | |
| N—H at % | 16.6 | 16.5 | 16.9 | 0.4 | | |
| S—H at % | 17.6 | 14.1 | 15.5 | 3.5 | | |
| WER Å/min | 1575 | 960 | 1822 | 862 | | |
| 2 | | | | | 2479 | 21.9 |
| Thickness Å | 6532 | 7970 | 6560 | 1438 | | |
| RI | 1.9 | 1.91 | 1.9 | 0.01 | | |
| Stress* ×10$^9$ dynes/cm$^2$ | +2.0 | −4.4 | −2.4 | 6.4 | | |
| N—H at % | 18.6 | 22.5 | 23.2 | 4.6 | | |
| S—H at % | 14.8 | 7.2 | 6.7 | 8.1 | | |
| WER Å/min | 826 | 395 | 468 | 431 | | |

TABLE THREE-continued

Properties of the a-SiN$_x$:H Gate Dielectric Film Deposited by PECVD

| Run No. | Chamber Near Window Side "A" | Chamber Near Center "C" | Chamber Near Slit Valve Side "B" | Maximum Difference | D/R Å/min | Variation in Film Thickness Uniformity, % (excluding 15 mm from edge of substrate) |
|---|---|---|---|---|---|---|
| 3 | | | | | 2364 | 10.8 |
| Thickness Å | 6605 | 7119 | 6641 | 514 | | |
| RI | 1.88 | 1.89 | 1.87 | 0.02 | | |
| Stress* ×10⁹ dynes/cm² | +3.0 | −2.5 | −2 | 5.5 | | |
| N—H at % | 21.6 | 26.1 | 27.5 | 5.9 | | |
| S—H at % | 16.2 | 9.2 | 7.2 | 9 | | |
| WER Å/min | 1137 | 554 | 882 | 583 | | |
| 4 | | | | | 2653 | 9.6 |
| Thickness Å | 7830 | 7775 | 7271 | 559 | | |
| RI | 1.91 | 1.93 | 1.92 | 0.02 | | |
| Stress* ×10⁹ dynes/cm² | +2.1 | −2.9 | −0.5 | 5 | | |
| N—H at % | 20.1 | 24.3 | 29.6 | 9.5 | | |
| S—H at % | 23 | 19.6 | 26.9 | 7.3 | | |
| WER Å/min | 784 | 363 | 664 | 421 | | |
| 5 | | | | | 2492 | 10.3 |
| Thickness Å | 7320 | 7929 | 7430 | 609 | | |
| RI | 1.86 | 1.88 | 1.86 | 0.02 | | |
| Stress* ×10⁹ dynes/cm² | +4.4 | −1.1 | +3.9 | 5.5 | | |
| N—H at % | 19.2 | 23.2 | 24.8 | 5.6 | | |
| S—H at % | 19.4 | 9.8 | 19.9 | 10.1 | | |
| WER Å/min | 2422 | 821 | 2023 | 1601 | | |
| 6 | | | | | 1374 | 15.7 |
| Thickness Å | 6165 | 7472 | 6086 | 1386 | | |
| RI | 1.91 | 1.9 | 1.92 | 0.02 | | |
| Stress* ×10⁹ dynes/cm² | +2.5 | −1.6 | +1.0 | 4.1 | | |
| N—H at % | 17.5 | 21.1 | 18 | 3.6 | | |
| S—H at % | 18.4 | 7.6 | 13.3 | 10.9 | | |
| WER Å/min | 860 | 494 | 483 | 377 | | |
| 7 | | | | | 2286 | 16.2 |
| Thickness Å | 7013 | 8764 | 6999 | 1765 | | |
| RI | 1.91 | 1.9 | 1.91 | 0.01 | | |
| Stress* ×10⁹ dynes/cm² | −2.2 | −3.9 | −1.6 | 2.3 | | |
| N—H at % | 20.5 | 20.7 | 20.7 | 0.2 | | |
| S—H at % | 11.1 | 7.7 | 11 | 3.4 | | |
| WER Å/min | 487 | 443 | 488 | 45 | | |
| 8 | | | | | 1711 | 12.4 |
| Thickness Å | 6230 | 7413 | 6576 | 1183 | | |
| RI | 1.91 | 1.9 | 1.9 | 0.01 | | |
| Stress* ×10⁹ dynes/cm² | −1 | −3.7 | −2 | 2.7 | | |
| N—H at % | 22.5 | 24.5 | 22.9 | 2 | | |
| S—H at % | 11.1 | 7.6 | 10.3 | 3.5 | | |

TABLE THREE-continued

Properties of the a-SiN$_x$:H Gate Dielectric Film Deposited by PECVD

| Run No. | Chamber Near Window Side "A" | Chamber Near Center "C" | | Maximum Difference | D/R Å/min | Variation in Film Thickness Uniformity, % (excluding 15 mm from edge of substrate) |
|---|---|---|---|---|---|---|
| WER Å/min | 554 | 529 | 579 | 50 | | |
| 9 | | | | | 1563 | 15.4 |
| Thickness Å | 5421 | 6758 | 5871 | 1337 | | |
| RI | 1.92 | 1.91 | 1.91 | 0.01 | | |
| Stress* ×10$^9$ dynes/cm$^2$ | −5.3 | −8.1 | −5.3 | 2.8 | | |
| N—H at % | 22 | 24.8 | 22.5 | 2.8 | | |
| S—H at % | 7.8 | 4.8 | 7.9 | 3.1 | | |
| WER Å/min | 381 | 404 | 410 | 29 | | |
| 10 | | | | | 1622 | 13.3 |
| Thickness Å | 5555 | 6788 | 5857 | 1233 | | |
| RI | 1.93 | 1.92 | 1.92 | 0.01 | | |
| Stress* ×10$^9$ dynes/cm$^2$ | −4.6 | −7.5 | −5.4 | 2.9 | | |
| N—H at % | 22.6 | 25.3 | 23.8 | 2.7 | | |
| S—H at % | 8.5 | 5.1 | 7.8 | 3.3 | | |
| WER Å/min | 353 | 360 | 395 | 42 | | |
| 11 | | | | | 1327 | 8.3 |
| Thickness Å | 5888 | 6940 | 6131 | 1052 | | |
| RI | 1.88 | 1.88 | 1.88 | 0 | | |
| Stress* ×10$^9$ dynes/cm$^2$ | −2.3 | −4.2 | −2.1 | 2.1 | | |
| N—H at % | 28.4 | 28.3 | 27.6 | 0.8 | | |
| S—H at % | 4.7 | 2.9 | 4.7 | 1.8 | | |
| WER Å/min | 739 | 695 | 767 | 72 | | |

*+ denotes tensile stress and − denotes compressive stress.

TABLE FOUR

Process Conditions For Deposition of the a-SiN$_x$:H Gate Dielectric Film Deposited by PECVD

| Run No. | SiH$_4$ sccm | NH$_3$ sccm | N$_2$ sccm | RF[1] kW | Pr[2] Torr | Elect[3] Spcg Mil | DR[4] Å/min | NH$_3$/ SiH$_4$ | N$_2$/ SiH$_4$ | N$_2$/ NH$_3$ |
|---|---|---|---|---|---|---|---|---|---|---|
| 1 | 2760 | 12340 | 30820 | 11 | 1.5 | 1090 | 2015 | 4.5 | 11 | 2.5 |
| 2 | 2800 | 9600 | 28000 | 15 | 1.5 | 1050 | 2479 | 3.4 | 10 | 2.9 |
| 3 | 2800 | 9600 | 28000 | 15 | 1.8 | 1050 | 2364 | 3.4 | 10 | 2.9 |
| 4 | 3500 | 12000 | 35000 | 15 | 1.5 | 1050 | 2653 | 3.4 | 10 | 2.9 |
| 5 | 3300 | 15600 | 38200 | 14 | 1.8 | 1050 | 2492 | 4.7 | 12 | 2.4 |
| 6 | 2000 | 8800 | 32000 | 9 | 1.4 | 1000 | 1374 | 4.4 | 16 | 3.6 |
| 7 | 3500 | 29000 | 22000 | 15 | 1.5 | 800 | 2286 | 8.3 | 6.3 | 0.8 |
| 8 | 2500 | 20000 | 22000 | 11 | 1.7 | 600 | 1711 | 8 | 8.8 | 1.1 |
| 9 | 3300 | 36000 | 18000 | 11 | 1.3 | 600 | 1563 | 11 | 5.5 | 0.5 |
| 10 | 3300 | 28000 | 18000 | 11 | 1.3 | 600 | 1622 | 8.5 | 5.5 | 0.5 |
| 11 | 1500 | 15000 | 28000 | 8 | 1.5 | 600 | 1327 | 10 | 19 | 1.9 |

[1]RF power at 13.56 MHz.
[2]Process chamber pressure.
[3]Electrode spacing.
[4]Deposition Rate.

A review of the data presented above indicates that it is possible to obtain an a-SiN$_x$:H gate dielectric film useful as a TFT gate dielectric, where large numbers of the TFTs are arrayed over surface areas larger than about 1000 mm×1000 mm. However, to obtain the uniformity of the film thickness and uniformity of film composition, it is necessary to carefully control the process parameters used in production of the a-SiN$_x$:H gate dielectric film. With respect to uniformity of chemical composition of the film across the wafer, it is preferred that the S—H bonded structure not vary by more than 4 atomic %. With respect to uniformity of other film properties across the wafer, it is preferred that the variation in stress be less than about 4×10$^9$ dynes/cm$^2$, and that the wet etch rate (WER), which is also an indication of density, not vary more than 100 Å/min over the entire surface of the substrate.

As previously discussed, to meet industry requirements, it is preferred that the film deposition rate is more than 1000 Å/min, and typically more than 1300 Å/min. Further, with respect to film properties of the a-SiN$_x$:H gate dielectric film, the Si—H bonded content of the film should be less than about 15 atomic %; the film stress should range from about 0 to about −10$^{10}$ dynes/cm$^2$; the film thickness across the substrate surface area should vary by less than about 17%; the refractive index (RI) of the film should range from about 1.85 to about 1.95; and, the wet etch rate in HF solution (which is an indication of film density) should be less than 800 Å/min. In addition, the chemical composition of the film, in terms of Si—H bonded content, should be consistently below the 15 atomic % maximum limit.

An a-SiN$_x$:H gate dielectric film exhibiting the physical characteristics listed above provides excellent performance capabilities, and the uniformity of the film across the substrate enables the production of flat panel displays having dimensions in the range of 1870 mm×2200 mm (a surface area of 4.1 m$^2$) and even larger.

We were surprised to discover that by increasing the NH$_3$:SiH$_4$ ratio to range between 5.3 to 10.0, while decreasing the N$_2$:SiH$_4$ ratio to range between 5.5 and 18.7, we were able to deposit a-SiN$_x$:H dielectric film with a film thickness which varied by less than about 16% over the substrate surface, while maintaining a Si—H bonded content in the film of less than 15 atomic %. The resulting N$_2$:NH$_3$ ratio due to this change ranged from about 0.6 to 1.9, which compared with the previous N$_2$:NH$_3$ ratio of 2.4 to 10. We also maintained a wet etch rate below about 800 Å/min over the a-SiN$_x$:H dielectric film surface using the new precursor source gas composition.

The combination process parameters required to produce the a-SiN$_x$:H gate dielectric film having the properties and uniformity described above include the following:

a substrate temperature during film deposition ranging from about 320° C. to about 340° C.;

a process pressure of less than about 2.0 Torr, typically less than about 1.5 Torr;

a power density ranging between about 0.2 W/cm$^2$ and about 0.6 W/cm$^2$;

a plasma precursor gas mixture in which the precursors gases include N$_2$, NH$_3$, and SiH$_4$, and where the component ratios are NH$_3$ : SiH$_4$ ranging from about 5.3 to about 10.0, N$_2$ : SiH$_4$ ranging from about 5.5 to about 18.7, and N$_2$ : NH$_3$ ranging from about 0.6 to about 2.3, typically from 0.6 to 1.9;

an electrode spacing in an AKT™ PECVD 25KA System, a parallel plate plasma processing chamber, which spacing is less than about 1000 mils (1 mil =0.001 inch), and which typically ranges between about 800 mils and 400 mils;

and, a total precursor gas flow rate in the AKT™ PECVD 25KA System ranging from about 20,000 sccm to about 70,000 sccm.

One skilled in the art can calculate an equivalent electrode spacing and precursor gas flow rate when the plasma processing chamber is different from the processing chamber specified above.

The combination process parameters required to produce an a-SiN$_x$:H passivation dielectric film are different from those required to produce a gate dielectric film, as previously described in the Summary of the Invention. For example, the important performance characteristics of the passivation dielectric layer are not ion mobility and voltage threshold (as for the gate dielectric film), but are, instead, breakdown voltage, step coverage, and mechanical properties (such as residual film stress). An acceptable passivation layer may exhibit, for example, a WER of 5000 or higher and a S—H bonded structure content of 20% or higher and still be acceptable. With respect to the ratios of precursor gases used for PECVD of a passivation layer of a-SiN$_x$:H, the ratio of NH$_3$:SiH$_4$ may easily range, for example and not by way of limitation, from about 5.6 to about 11.1, typically from about 5.6 to about 10.6. The ratio of N$_2$:SiH$_4$ may range, for example and not by way of limitation, from about 5.8 to about 20.8, and typically from about 5.8 to about 19.9. The ratio of N$_2$:NH$_3$ may range, for example and not by way of limitation, from about 0.4 to about 2.3, and typically from about 0.6 to about 1.9.

Figure 4A:
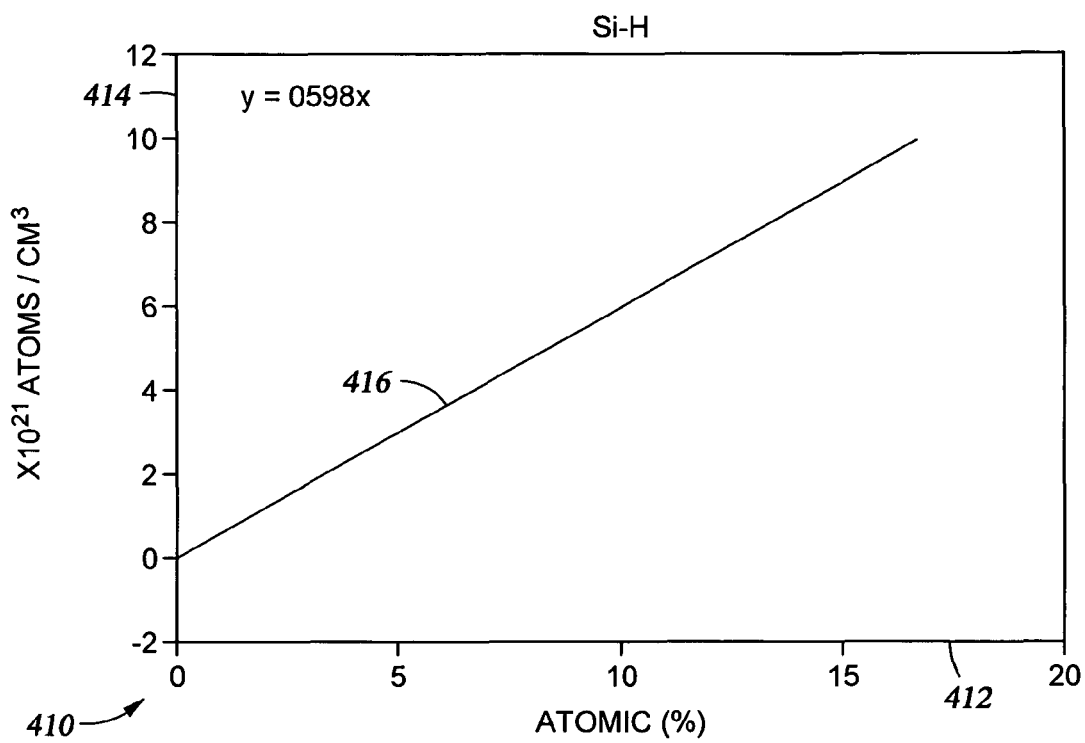
FIG. 4A shows a graph illustrating the relationship between the atomic % of Si—H bonded structure in the a-SiN$_x$:H dielectric film and the concentration of the Si—H bonded structure in terms of atoms which make up that structure/cm$^3$ of the a-SiN$_x$:H dielectric film.

FIG. 4A is a graph 410 which shows the relationship between the atomic weight % of Si—H bonded structure in the a-SiN$_x$:H gate dielectric film and the concentration of the Si—H bonded structure in terms of atoms which make up that structure, per cubic centimeter of the a-SiN$_x$:H film. The atomic weight % of Si—H bonded structure is shown on the "x" axis, which is labeled 412. The a-SiN$_x$:H film density in atoms/cm$^3$ is shown on the "y" axis, which is labeled 414. The relationship represented by curve 416 is y=0.598 x, which is the correlation. This graph is presented for reference purposes to aid in understanding of the description of the invention.

Figure 4B:
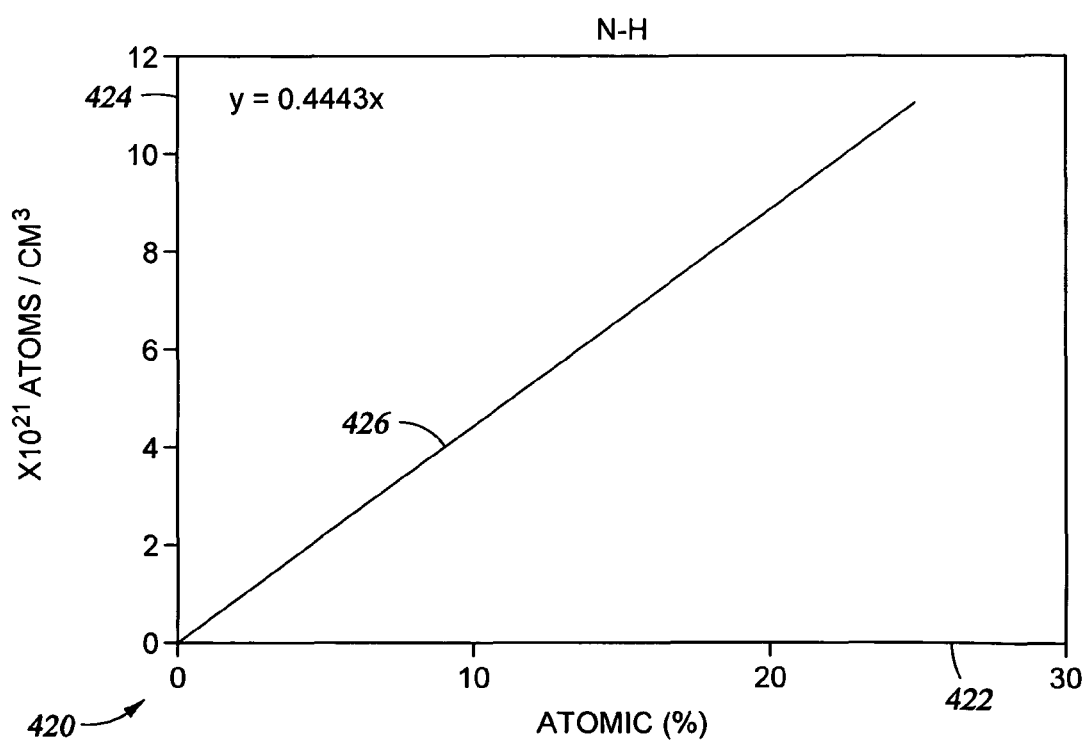
FIG. 4B shows a graph which illustrates the relationship between the atomic % of the N—H bonded structure in the a-SiN$_x$:H dielectric film and the concentration of the N—H bonded structure in terms of atoms which make up that structure/cm$^3$ of the a-SiN$_x$:H dielectric film.

FIG. 4B is a graph 420 which shows the relationship between the atomic weight % of N—H bonded structure in the a-SiN$_x$:H gate dielectric film and the concentration of the N—H bonded structure in terms of atoms which make up that structure, per cubic centimeter of the a-SiN$_x$:H film. The atomic weight % of N—H bonded structure is shown on the "x" axis, which is labeled 422. The a-SiN$_x$:H film density in atoms/cm$^3$ is shown on the "y" axis, which is labeled 424. The relationship represented by curve 426 is y=0.4443 x, which is the correlation. This graph is presented for reference purposes to aid in understanding of the description of the invention.

An a-SiN$_x$:H film deposited according to the method parameters described above can be used in any application in which a-SiN$_x$:H films are useful. However, as mentioned above, a-SiN$_x$:H film deposited according to the present method are particularly useful in the production of large surface area flat panel displays.

Example Two

PECVD Deposition of a-SiN$_x$:H Gate Dielectric Layers of Uniform Thickness by Controlling a Combination of Process Parameters As discussed above, we have discovered that controlling a combination of PECVD deposition process parameters during deposition of silicon-containing thin film provides improved control over surface standing wave effects. These process parameters include: the spacing between the upper and lower electrodes in the plasma reactor; the RF frequency of the plasma source; the RF power to the plasma source; the process chamber pressure; and the relative concentrations of the various components in the precursor gas composition.

We performed a series of experiments to determine the advantageous ranges for each process parameter, in order to provide maximum control over surface standing wave effects and uniformity of film properties (especially film thickness). A comparison between film uniformity available prior to the present invention and film uniformity now available is presented below.

Figure 7A:
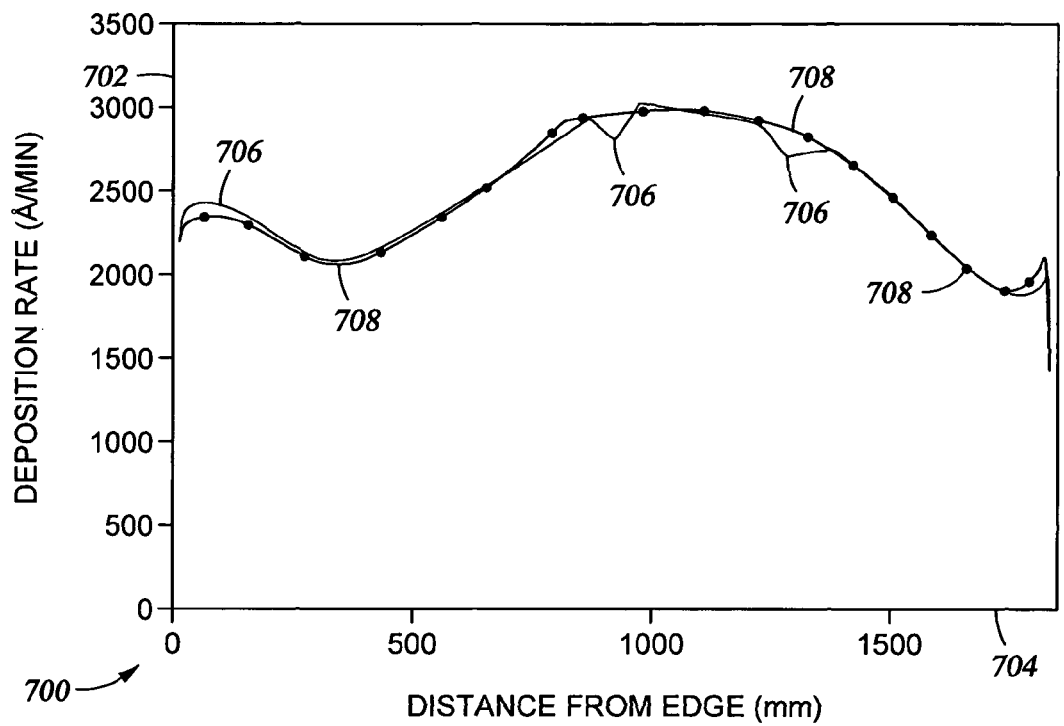
FIGS. 7A-7C are graphs of the film deposition rate (in Å/min) for a PECVD deposited a-SiN$_x$:H film, as a function of the distance of travel across a diagonal of a rectangular substrate from edge to edge in mm, where the length of the substrate was 1850 mm and the width of the substrate was 1500 mm (for a total substrate area of 27,750 cm$^2$). The graphs show data for measurements made across each diagonal of each substrate, but plotted on axis 704 based on travel along the 1850 mm dimension of the substrate.

FIG. 7A illustrates data for film uniformity which was available prior to the present invention. FIG. 7A is a graph 700 showing the film deposition rate (in Å/min) for a PECVD-deposited, a-SiN$_x$:H film on axis 702 as a function of the distance of travel across the diagonal of a rectangular substrate measuring 1850 mm×1500 mm (for a total substrate area of 27,750 cm$^2$). The graph shows data for one diagonal on curve 706 and data for the other diagonal on curve 708, but plotted on axis 704 based on travel along the 1850 mm dimension of the substrate.

The process conditions under which the a-SiNx:H film shown in FIG. 7A was deposited are shown below in Table Five and the properties of the deposited film are shown in Table Six below. The film was deposited in an AKT™ 25 KA PECVD System, which is capable of processing substrates having dimensions of up to 1500 mm×1850 mm.

TABLE FIVE

Process Conditions for PECVD Deposition of an a-SiN$x$:H Film Prior to the Present Improved Process

| Process Variable | Process Conditions |
|---|---|
| SiH$_4$ Flow (sccm) | 2800 |
| NH$_3$ Flow (sccm) | 9600 |
| N$_2$ Flow (sccm) | 28000 |
| Total Gas Flow Rate (sccm) | 40400 |
| RF Power (kW) | 15 |
| Chamber Pressure (Torr) | 1.5 |
| Heater Temp. & Substrate Temp. (° C.)* | 340/370 (330) |
| Electrode Spacing (mils) | 1050 |
| Deposition Rate (Å/min) | 2405 |
| Deposition Time (sec) | 180 |

*The first number is the interior heater and the second number is the exterior heater. The number in parenthesis is the approximate substrate temperature.

TABLE SIX

Properties of the a-SiN$_x$ Film Deposited Under the Conditions in Table Five, (Comparative Example)

| A-Si Film Property | Chamber Near Window Side "A" | Chamber Near Center "C" | Chamber Near Slit Valve Side "B" | Difference | D/R Å/min | Unif |
|---|---|---|---|---|---|---|
| Thickness Å | 6357 | 8385 | 6550 | 2028 | 2405 | |
| RI | 1.93 | 1.9 | 1.91 | 0.03 | | |
| Stress* ×10$^9$ dynes/cm$^2$ | 1.8 | −8.2 | −4 | 10 | | |
| N—H atomic % | 17.3 | 26.4 | 24.1 | 9.1 | | |
| S—H atomic % | 16.9 | 2.7 | 5.7 | 14.2 | | |
| WER Å/min | 673 | 380 | 373 | 300 | | |
| Thickness Uniformity @ −15 mm from edge of substrate (%) | | | | | | 36 |
| Thickness Uniformity @ −20 mm from edge of substrate (%) | | | | | | 24 |

*+ denotes tensile stress and − denotes compressive stress.

Figure 7B:
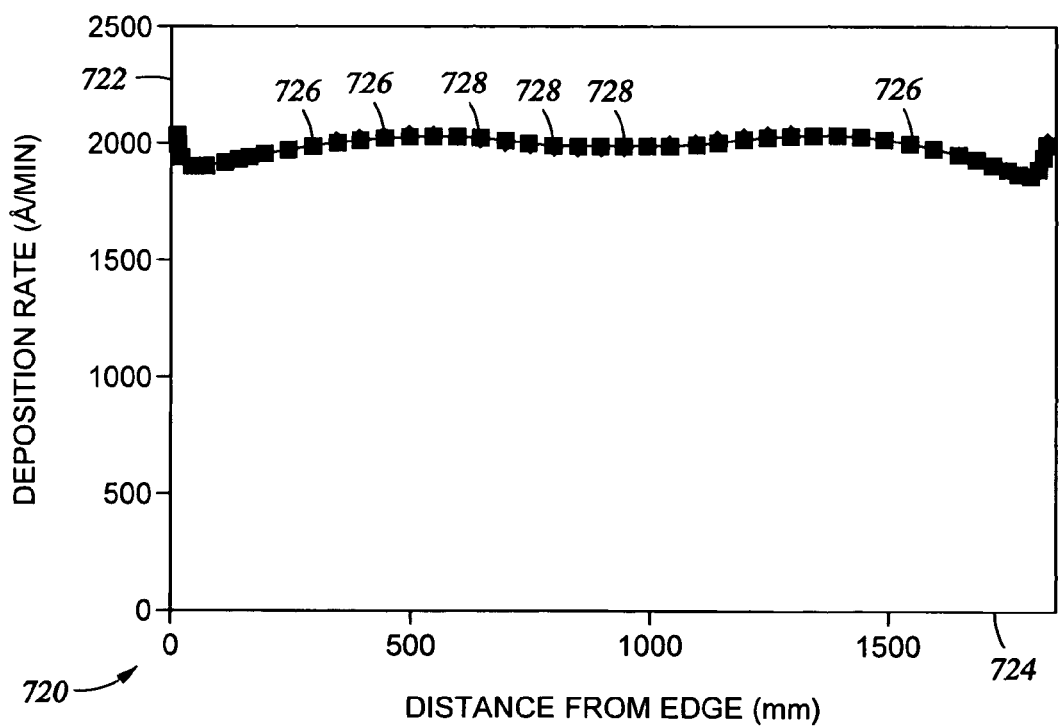

FIG. 7B illustrates data for film uniformity which was obtained using the method of the present invention. FIG. 7B is a graph 720 showing the film deposition rate (in Å/min) of the PECVD-deposited a-SiN$_x$ film on axis 722 as a function of the distance of travel across a diagonal of the rectangular substrate. The graph shows data for one diagonal on curve 726 and data for the other diagonal on curve 728, but plotted on axis 724 based on travel along the 1850 mm dimension of the substrate.

The process conditions under which an a-SiNx:H film shown in FIG. 7B was deposited is shown below in Table Seven and the properties of the deposited film are shown in Table Eight below. The film was deposited in an AKT™ 25 KA PECVD System, which is capable of processing substrates having dimensions of up to 1500 mm×1850 mm.

TABLE SEVEN

Process Conditions for PECVD Deposition of an a-SiNx:H Film Current Improved Process Variables, Example "A"

| Process Variable | Process Conditions |
| --- | --- |
| SiH$_4$ Flow (sccm) | 2550 |
| NH$_3$ Flow (sccm) | 13500 |
| N$_2$ Flow (sccm) | 15000 |
| Total Gas Flow Rate (sccm) | 31050 |
| RF Power (kW) | 10 |
| Chamber Pressure (Torr) | 1.5 |
| Heater Temp. & Substrate Temp. (° C.)* | 340/370 (330) |
| Electrode Spacing (mils) | 700 |
| Deposition Rate (Å/min) | 1591 |
| Deposition Time (sec) | 300 |

*The first number is the interior heater and the second number is the exterior heater. The number in parenthesis is the approximate substrate temperature.

TABLE EIGHT

Properties of the a-SiN$_x$ Film Deposited Under the Conditions in Table Seven, (Inventive Example "A")

| A-Si Film Property | Chamber Near Window Side "A" | Chamber Near Center "C" | Chamber Near Slit Valve Side "B" | Difference | D/R Å/min | Unif |
| --- | --- | --- | --- | --- | --- | --- |
| Thickness Å | 7498 | 8399 | 7645 | 901 | 1591 | |
| RI | 1.93 | 1.92 | 1.93 | 0.01 | | |
| Stress* ×10$^9$ dynes/cm$^2$ | −1 | −2.8 | −0.7 | 2.1 | | |
| N—H atomic % | 18.5 | 19.9 | 18.9 | 1.4 | | |
| S—H atomic % | 14.1 | 11.5 | 14.1 | 2.6 | | |
| WER Å/min | 506 | 504 | 628 | 124 | | |
| Thickness Uniformity @ −15 mm from edge of substrate (%) | | | | | | 6.7 |
| Thickness Uniformity @ −20 mm from edge of substrate (%) | | | | | | 6.7 |

*+ denotes tensile stress and − denotes compressive stress.

Figure 7C:
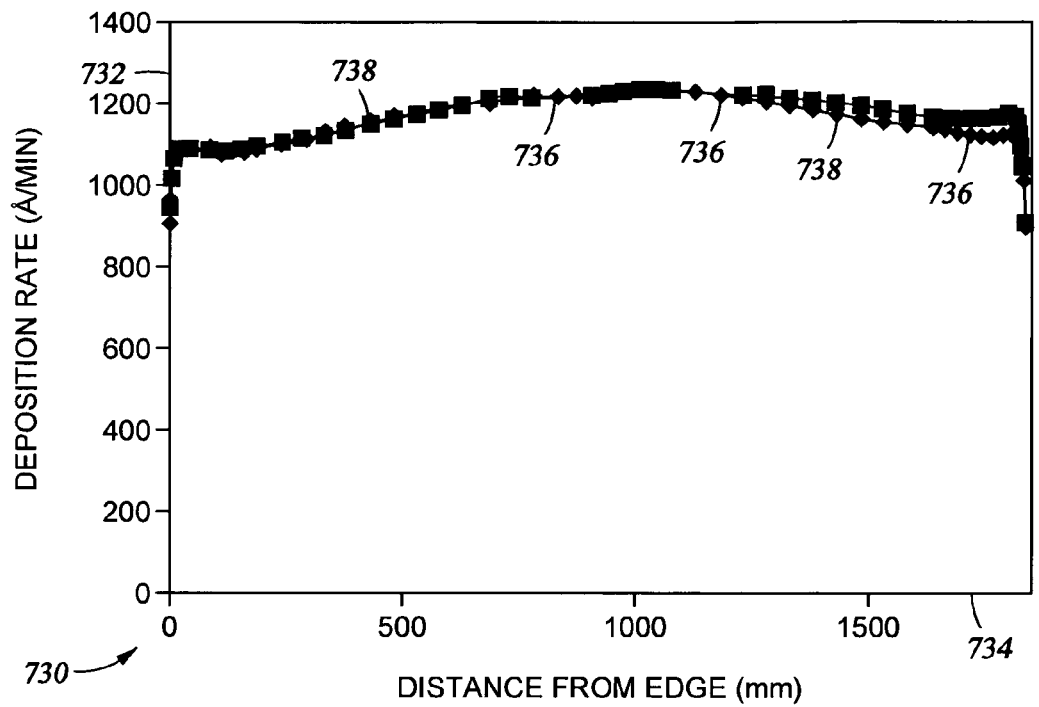

FIG. 7C illustrates data for film uniformity which was obtained using the method of the present invention. FIG. 7C is a graph 730 showing the film deposition rate (in Å/min) of the PECVD-deposited a-SiN$_x$ film on axis 732 as a function of the distance of travel across a diagonal of the rectangular substrate. The graph shows data for one diagonal on curve 736 and data for the other diagonal on curve 738, but plotted on axis 734 based on travel along the 1850 mm dimension of the substrate.

The process conditions under which the a-SiNx:H film shown in FIG. 7C was deposited is shown below in Table Nine and the properties of the deposited film are shown in Table Ten below. The film was deposited in an AKT™ 25 KA PECVD System, which is capable of processing substrates having dimensions of up to 1500 mm×1850 mm.

TABLE NINE

Process Conditions for PECVD Deposition of an a-SiNx:H Film Using Current Improved Process Variables, Example "B"

| Process Variable | Process Conditions |
| --- | --- |
| SiH$_4$ Flow (sccm) | 1450 |
| NH$_3$ Flow (sccm) | 13500 |
| N$_2$ Flow (sccm) | 18000 |
| Total Gas Flow Rate (sccm) | 32950 |
| RF Power (kW) | 8 |
| Chamber Pressure (Torr) | 1.2 |
| Heater Temp. & Substrate Temp. (° C.)* | 340/370 (330) |
| Electrode Spacing (mils) | 650 |
| Deposition Rate (Å/min) | 1148 |
| Deposition Time (sec) | 300 |

*The first number is the interior heater and the second number is the exterior heater. The number in parenthesis is the approximate substrate temperature.

TABLE TEN

Properties of the a-SiN$_x$ Film Deposited Under the Conditions in Table Nine, (Inventive Example "B")

| A-Si Film Property | Chamber Near Window Side "A" | Chamber Near Center "C" | Chamber Near Slit Valve Side "B" | Difference | D/R Å/min | Unif |
| --- | --- | --- | --- | --- | --- | --- |
| Thickness Å | 5471 | 6107 | 5619 | 636 | 1148 | |
| RI | 1.9 | 1.89 | 1.89 | 0 | | |
| Stress* ×10$^9$ dynes/cm$^2$ | −4.6 | −7.1 | −4.4 | 2.7 | | |
| N—H atomic % | 26 | 28.2 | 26.2 | 2.2 | | |
| S—H atomic % | 4.5 | 2.6 | 4.6 | 2.1 | | |
| WER Å/min | 488 | 505 | 574 | 86 | | |
| Thickness Uniformity @ −15 mm from edge of substrate (%) | | | | | | 8.3 |
| Thickness Uniformity @ −20 mm from edge of substrate (%) | | | | | | 7.6 |

*+ denotes tensile stress and − denotes compressive stress.

A comparison of the data presented above shows that by adjusting a combination of process variables, particularly including reducing the spacing between electrodes, lowering of the plasma density (a reduction in the amount of power applied for plasma generation and maintenance), and adjustment of the plasma source gas composition, a very significant improvement in film uniformity across the substrate can be obtained. We were able to reduce the film non-uniformity at 15 mm from edge of substrate from about 36% to about 7%. At 20 mm from edge of substrate, we were able to reduce the film non-uniformity from about 23% to about 7%.

Figure 8A:
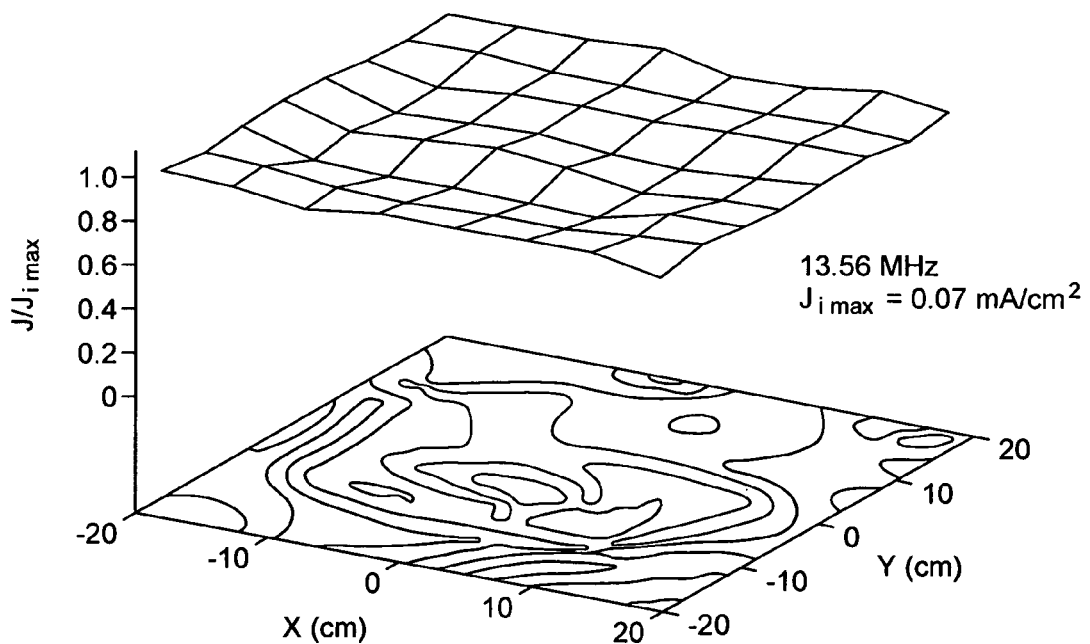
FIGS. 8A-8C are topographical maps and corresponding three dimensional renderings of the relative electron density distribution for a square discharge 20 cm×20 cm at 150 mTorr argon and 50 W of RF power, for a parallel plate processing chamber, where 8A represents an RF frequency of 13.56 MHz, 8B represents an RF frequency of 60 MHz, and 8C represents an RF frequency of 81.36 MHz. Relative Ion flux density at the center of the square=1.
Figure 8B:
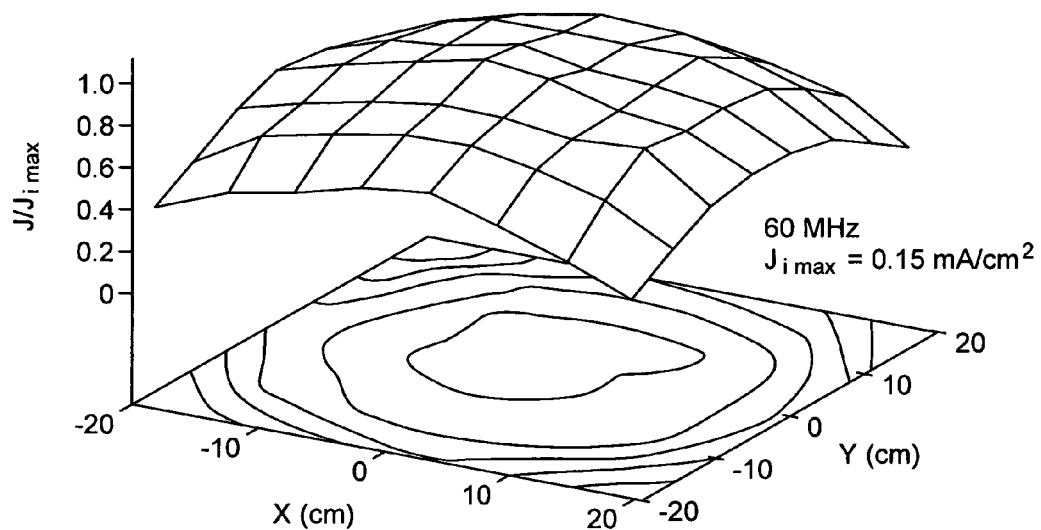
Figure 8C:
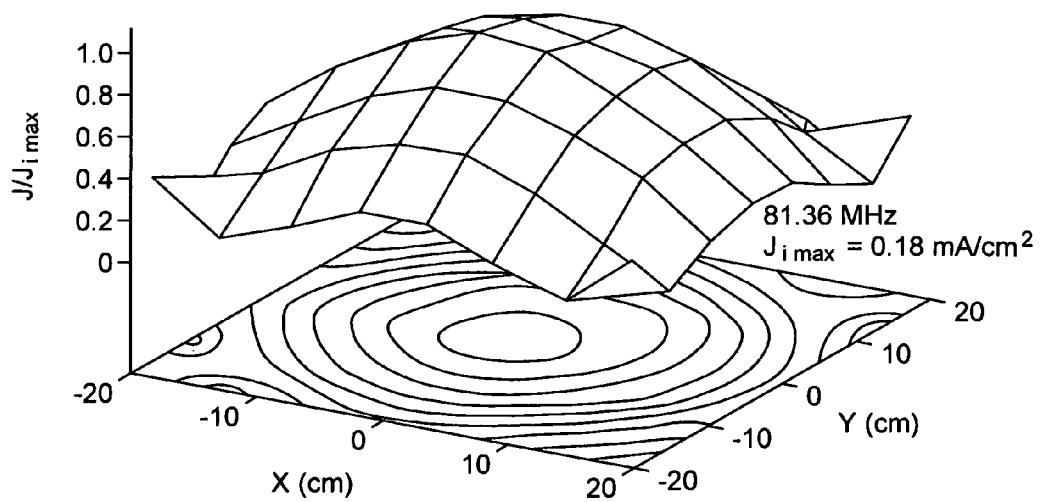

FIGS. 8A-8C are topographical maps and corresponding three dimensional renderings of the relative electron density distribution for a square discharge 20 cm×20 cm at 150 mTorr argon and 50 W of RF power, for a parallel plate processing chamber, where 8A represents an RF frequency of 13.56 MHz, 8B represents an RF frequency of 60 MHz, and 8C represents an RF frequency of 81.36 MHz. All of the experimental examples presented above were for a plasma source power applied at a frequency of 13.56 MHz. However, as the substrates to be processed grow increasingly larger, it may become advantageous to use RF frequency as an additional tool for controlling the uniformity of film thickness across the substrate surface.

As can be seen by comparing FIG. 8B and FIG. 8C with FIG. 8A, an increase in frequency directly relates to a very significant increase in the non-uniformity of plasma density distribution across a substrate surface. We have used RF frequencies as low as 7 MHz and obtained excellent preliminary results. However, at 2 MHz, we observed an increase in film roughness and a decrease in film uniformity which has been attributed to ion bombardment of the depositing film surface.

While the invention has been described in detail above with reference to several embodiments, various modifications within the scope and spirit of the invention will be apparent to those of working skill in this technological field. Accordingly, the scope of the invention should be measured by the appended claims.

We claim:

1. A method of improving film deposition uniformity of a PECVD deposited film, wherein a deposition plasma is formed directly over a substrate surface having an equivalent radius of about 0.7 meter or greater, comprising:
   providing a substrate having a surface equivalent radius of about 0.7 meter or greater;
   placing said substrate in a parallel plate processing chamber;
   setting an electrode spacing between parallel plate electrodes in said parallel plate processing chamber to be below about 1000 mils;
   setting an R.F. power frequency to be between about 13.56 MHZ and about 3 MHZ;
   setting an electron density of a plasma used during deposition of said PECVD-deposited film to be less than about $10^{10}/cm^3$;
   selecting a plasma source gas in which reactive species are dissociated at an electron density used during deposition of said film;
   setting a total gas flow in said processing chamber so that a volumetric gas turnover rate in said processing chamber is at least 0.015 processing chamber volumes per minute; and
   depositing said PECVD-deposited film, wherein surface standing wave effects are controlled during film deposition, so that a film deposition rate of at least 1,000Å/min is achieved over said substrate surface having an equivalent radius of about 0.7 meter or greater, in combination with a film thickness variation over said substrate surface of less than about 10.8 %.

2. A method in accordance with claim 1, wherein said PECVD deposited film is a silicon-containing film.

3. A method in accordance with claim 2, wherein said silicon-containing film is selected from the group consisting of silicon nitride, silicon oxide, and combinations thereof.

4. A method in accordance with claim 3, wherein an a-SiN$_x$:H film is deposited and wherein the ratio of NH$_3$:SiH$_4$ in the plasma source gas ranges from about 3.4 to about 10.0, while the ratio of NH$_2$:NH$_3$ ranges from about 1.9 to about 2.9, whereby the variation in film thickness uniformity over said substrate surface increases to range from about 8.3 % to about 10.8 %, while a Si—H bonded content is reduced to less than about 15 atomic %.

5. A method in accordance with claim 1 or claim 2, wherein a pressure at the surface of the substrate during film formation is less than about 1.5 Torr.

6. A method in accordance with claim 5, wherein said pressure ranges from about 0.5 Torr to about 1.5 Torr.

7. A method in accordance with claim 6, wherein said pressure ranges from about 0.7 Torr to about 1.0 Torr.

8. A method in accordance with claim 1 or claim 2, wherein a plasma sheath width, s, is more than about 20 mils.

9. A method in accordance with claim 1 or claim 2, wherein said plasma thickness, 2d, is less than about 1000 mils.

10. A method in accordance with claim 2, wherein an a-SiN$_x$:H film is deposited and wherein the concentration of NH$_3$ in the plasma source gas mixture is such that the ratio of NH$_3$:SiH$_4$ ranges from about 2:1 to about 15:1, and the ratio of NH$_3$:N$_2$ ranges from about 0.3:1 to about 2:1.

11. A method in accordance with claim 1 or claim 2, wherein said spacing between electrodes ranges between about 400 mils and about 1000 mils.

12. A method in accordance with claim 1 or claim 2, wherein the amount of RF power applied to the plasma source gas ranges from about 0.2 W / cm$^2$ of substrate to about 0.6 W / cm$^2$ of substrate.

13. A method in accordance with claim 1 or claim 2, wherein the temperature of said substrate ranges from about 200° C. to about 400° C. during deposition of said film.

14. A method in accordance with claim 1, wherein said frequency ranges between about 13.56 MHZ and about 7 MHZ.

15. A method in accordance with claim 1, wherein said volumetric gas turnover rate ranges from about 0.015 to about 0.08 chamber volumes per minute.

16. A method in accordance with claim 15, wherein said volumetric gas turnover rate ranges from about 0.02 to about 0.07 chamber volumes per minute.

17. A method in accordance with claim 1, wherein said method is used to deposit a silicon-containing film selected from the group consisting of silicon nitride, silicon oxide, silicon oxynitride, a-Si, doped a-Si, and combinations thereof.

* * * * *